US012387913B2

(12) United States Patent
Buckfeller et al.

(10) Patent No.: US 12,387,913 B2
(45) Date of Patent: Aug. 12, 2025

(54) DYNAMIC VACUUM SEAL SYSTEM FOR PHYSICAL VAPOR DEPOSITION SPUTTER APPLICATIONS

(71) Applicant: TOSOH SMD, INC., Grove City, OH (US)

(72) Inventors: Joseph Buckfeller, Grove City, OH (US); Rick Eller, Grove City, OH (US); John Rizer, Grove City, OH (US); Lora Thrun, Grove City, OH (US); Gary Offord, Grove City, OH (US)

(73) Assignee: TOSOH SMD, INC., Grove City, OH (US)

( * ) Notice: Subject to any disclaimer, the term of this patent is extended or adjusted under 35 U.S.C. 154(b) by 0 days.

(21) Appl. No.: 19/014,165

(22) Filed: Jan. 8, 2025

(65) Prior Publication Data
US 2025/0149303 A1 May 8, 2025

Related U.S. Application Data

(63) Continuation of application No. 18/992,549, filed as application No. PCT/US2023/027301 on Jul. 10, 2023.
(Continued)

(51) Int. Cl.
*H01J 37/32* (2006.01)
*C23C 14/34* (2006.01)
(Continued)

(52) U.S. Cl.
CPC .... *H01J 37/32513* (2013.01); *C23C 14/3407* (2013.01); *C23C 14/564* (2013.01);
(Continued)

(58) Field of Classification Search
None
See application file for complete search history.

(56) References Cited

U.S. PATENT DOCUMENTS

D244,533 S     5/1977  Eidelberg
4,198,283 A *  4/1980  Class ................ H01J 37/3423
                                             204/192.12
(Continued)

FOREIGN PATENT DOCUMENTS

CN    112713077      4/2021
CN    112713077 A *  4/2021  ........ H01J 37/32513
(Continued)

OTHER PUBLICATIONS

Patent Cooperation Treaty (PCT), International Search Report and Written Opinion for Application PCT/US2023/027301 filed on Jul. 10, 2023 mailed Nov. 10, 2023, International Searching Authority, KR.
(Continued)

*Primary Examiner* — Jason Berman
(74) *Attorney, Agent, or Firm* — MCDONALD HOPKINS LLC

(57)  ABSTRACT

Provided is a vacuum seal and seal system including a corresponding isolation ring and a corresponding sputtering target. The seal and seal system may be used in PVD sputter applications. The seal may include a compressible portion and a rigid portion. The compressible portion may include two or more higher profile protrusions and two or more lower profile recesses that facilitate formation of a vacuum seal through compression by and between the isolation ring and the sputtering target. The seal may further include a removable and replaceable plasma shield that is attachable to a first end of the seal. The seal may further include a rim on a second end that selectively couples with a corresponding step-out portion of the isolation ring. The sputtering (Continued)

target may have a continuous peripheral flange surface. In an embodiment, the seal and seal system is self-centering.

28 Claims, 27 Drawing Sheets

Related U.S. Application Data

(60) Provisional application No. 63/367,914, filed on Jul. 8, 2022.

(51) Int. Cl.
*C23C 14/56* (2006.01)
*H01J 37/34* (2006.01)

(52) U.S. Cl.
CPC ....... *H01J 37/3411* (2013.01); *H01J 37/3435* (2013.01); *H01J 37/3441* (2013.01)

(56) References Cited

U.S. PATENT DOCUMENTS

| | | | |
|---|---|---|---|
| 5,112,469 A * | 5/1992 | Kempf | C23C 14/50 414/217 |
| D368,516 S | 4/1996 | Matsumura | |
| 5,518,593 A | 5/1996 | Hosokawa | |
| D380,039 S | 6/1997 | Sutherland | |
| D381,030 S | 7/1997 | Tepman | |
| 5,935,397 A * | 8/1999 | Masterson | H01J 37/3414 204/192.12 |
| 6,460,859 B1 | 10/2002 | Hammi | |
| 6,774,339 B1 | 8/2004 | Smathers | |
| D529,057 S | 9/2006 | Willson | |
| 7,390,580 B1 | 6/2008 | Dupont | |
| D631,948 S | 2/2011 | Yoshida | |
| 7,922,881 B2 | 4/2011 | Ivanov | |
| D638,523 S | 5/2011 | Yoshida | |
| D644,721 S | 9/2011 | Bond | |
| D646,764 S | 10/2011 | Rusconi | |
| D655,401 S | 3/2012 | Muramatsu | |
| 8,623,145 B2 | 1/2014 | Bowman | |
| D743,513 S | 11/2015 | Yamagishi | |
| D754,308 S | 4/2016 | Nakagawa | |
| 9,476,122 B2 | 10/2016 | Riker | |
| D802,723 S | 11/2017 | Miyamoto | |
| D818,089 S | 5/2018 | Kim | |
| D821,552 S | 6/2018 | Nakagawa | |
| D822,181 S | 7/2018 | Nakagawa | |
| D864,361 S | 10/2019 | Kim | |
| D871,609 S | 12/2019 | Isozaki | |
| D893,685 S | 8/2020 | Evans | |
| D895,075 S | 9/2020 | Kang | |
| D896,353 S | 9/2020 | Nakagawa | |
| D905,597 S | 12/2020 | Anderson | |
| D908,645 S | 1/2021 | Savandaiah | |
| 10,990,163 B2 | 4/2021 | Tennakoon | |
| D941,371 S | 1/2022 | Lavitsky | |
| D941,372 S | 1/2022 | Lavitsky | |
| D942,596 S | 2/2022 | Nakagawa | |
| D970,566 S | 11/2022 | Riker | |
| D981,970 S | 3/2023 | Inada | |
| D984,222 S | 4/2023 | Wang | |
| 11,670,493 B2 | 6/2023 | Lavitsky | |
| 11,874,443 B2 | 1/2024 | Yang | |
| 11,915,918 B2 | 2/2024 | Ramalingam | |
| 11,929,266 B2 | 3/2024 | Sakamoto | |
| D1,031,951 S | 6/2024 | Tsuji | |
| D1,042,374 S | 9/2024 | Nallagonda | |
| 2007/0107185 A1 | 5/2007 | Bailey | |
| 2008/0137320 A1 | 6/2008 | Ball | |
| 2009/0305509 A1 * | 12/2009 | Stevenson | H01J 37/32541 118/667 |
| 2010/0181187 A1 | 7/2010 | Krempel-Hesse et al. | |
| 2011/0139614 A1 | 6/2011 | Inanov et al. | |
| 2013/0125519 A1 | 5/2013 | Stephan et al. | |
| 2013/0186751 A1 | 7/2013 | Young | |
| 2015/0357169 A1 | 12/2015 | Yuan | |
| 2019/0096638 A1 | 3/2019 | Lavitsky et al. | |
| 2020/0090915 A1 | 3/2020 | Kerschbaumer | |
| 2021/0375650 A1 | 12/2021 | Satyavolu et al. | |
| 2024/0263702 A1 | 8/2024 | Buzzard | |

FOREIGN PATENT DOCUMENTS

| | | |
|---|---|---|
| JP | 1102367 | 3/2001 |
| JP | 1199310 | 3/2004 |
| JP | 1692414 | 8/2021 |
| KR | 301110077 | 5/2021 |
| KR | 301247186 | 1/2024 |
| TW | D186431 | 11/2017 |
| TW | D189096 | 3/2018 |
| TW | D193438 | 10/2018 |
| TW | D203064 | 3/2020 |
| TW | D208174 | 11/2020 |
| TW | D214021 | 9/2021 |
| TW | D226236 | 7/2023 |
| WO | 2021237032 | 11/2021 |
| WO | 2021247249 | 12/2021 |

OTHER PUBLICATIONS

Patent Cooperation Treaty (PCT), IPRP for PCT/US2023/027301 filed on Jul. 10, 2023 mailed Nov. 18, 2024, IPEA/US.
Taiwan Intellectual Property Office (TIPO), Search Report and Written Opinion for Taiwan Design Patent Application No. 113300067 filed on Jan. 5, 2024, mailed on Oct. 9, 2024, 9 pages.
Taiwan Intellectual Property Office (TIPO), Search Report and Written Opinion for Taiwan Design Patent Application No. 113300066 filed on Jan. 5, 2024, mailed on Sep. 11, 2024, 13 pages.
Korean Intellectual Property Office (KIPO), Search Report and Written Opinion for Korean Taiwan Design Patent Application No. 30-2024-0000688 filed on Jan. 5, 2024, mailed on Oct. 29, 2024, 2 pages.
Taiwan Intellectual Property Office (TIPO), Search Report and Written Opinion for Taiwan Design Patent Application No. 113300065 filed on Jan. 5, 2024, mailed on Jul. 15, 2024, 5 pages.
Parker Hannifin Corporation, Composite Sealing Systems, Mar. 2010, 8 pages.
Taiwan Intellectual Property Office (TIPO), Search Report and Written Opinion for Taiwan Design Patent Application No. 113300066 filed on Jan. 5, 2024, mailed on Apr. 11, 2025, 5 pages.
Taiwan Intellectual Property Office (TIPO), Search Report and Written Opinion for Taiwan Design Patent Application No. 113305100 filed Jan. 5, 2024, mailed on Apr. 18, 2025, 4 pages.
Taiwan Intellectual Property Office (TIPO), Search Report and Written Opinion for Taiwan Design Patent Application No. 113305101 filed Jan. 5, 2024, mailed on Apr. 18, 2025, 5 pages.

* cited by examiner

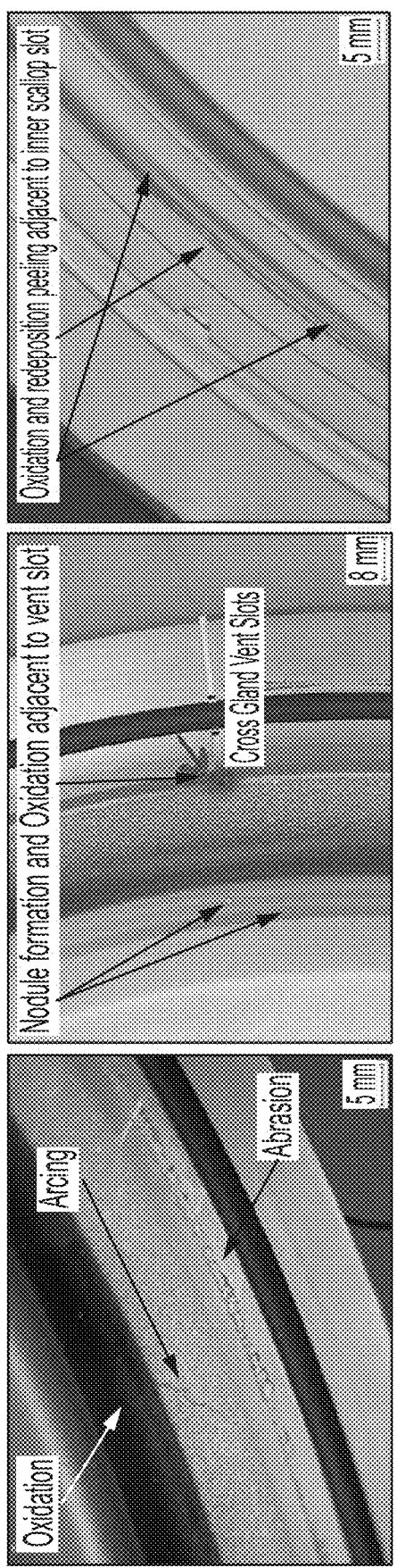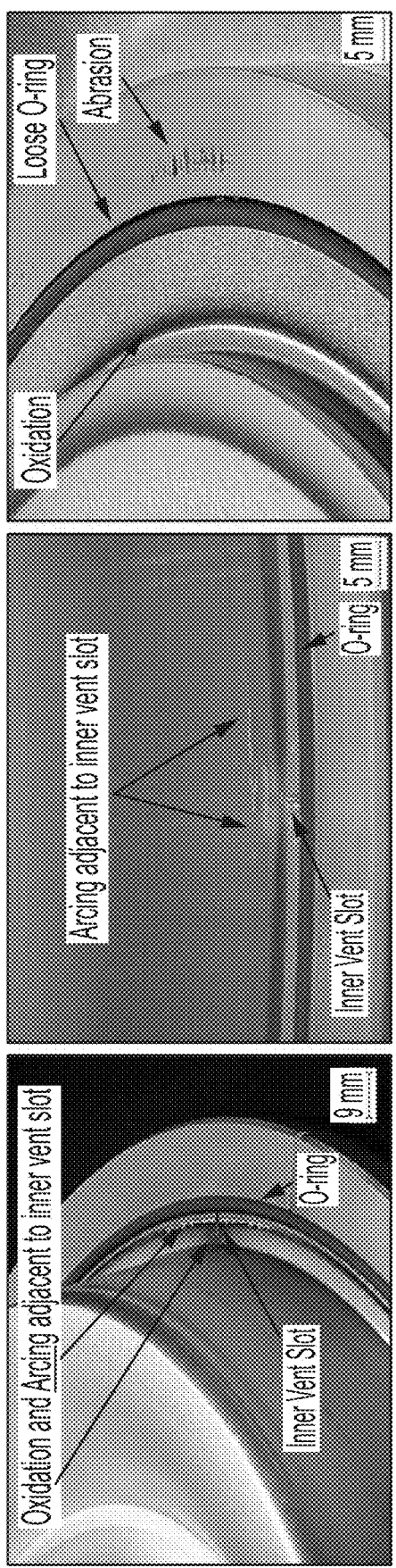
FIG. 2A FIG. 2B FIG. 2C
FIG. 2D FIG. 2E FIG. 2F

DYNAMIC VACUUM SEAL SYSTEM FOR PHYSICAL VAPOR DEPOSITION SPUTTER APPLICATIONS

CROSS REFERENCE TO RELATED APPLICATIONS

The application is a continuation of U.S. patent application Ser. No. 18/992,549 filed on Jan. 8, 2025, which is the U.S. National Phase Entry of International Application No. PCT/US2023/027301 filed on Jul. 10, 2023, which claims priority to U.S. Patent Application No. 63/367,914, filed on Jul. 8, 2022, entitled "Dynamic Vacuum Seal System for Physical Vapor Deposition Sputter Applications," each of which are incorporated herein by reference in their entireties.

FIELD OF THE INVENTION

The present disclosure relates generally to a dynamic vacuum seal system for physical vapor deposition sputter applications and, more particularly, to a vacuum seal and seal system including a corresponding isolation ring and a corresponding sputtering target that does not incorporate an O-ring and corresponding groove or any vent slots or scallops.

BACKGROUND

Physical Vapor Deposition (PVD) is a thin film deposition technique used in manufacturing processes to create coatings and coating patterns on a desired surface substrate. The technique can employ sputtering methods to transfer material from a solid source, e.g., a sputtering target, onto a substrate surface in a vacuum environment. PVD may be used in a variety of applications, such as semiconductor manufacturing, glass coatings, optical coatings, solar cell coatings, nanotechnology, and the like, to deposit thin film layers. Sputtering in vacuum environments may also be used to provide sputter cleaning, such as in ion plating.

In an example, PVD may involve bombarding a sputtering target with high-energy particles, such as ions or plasma, to eject atoms or molecules from the target surface, which thereby can become vapor in the vacuum chamber. The vaporized particles may then travel through the vacuum chamber and deposit onto the substrate surface, forming a thin film layer on the substrate surface. The sputtering target is consumed and has a finite life based on erosion characteristics and usable material. The composition of the deposited film is determined by the material composition of the sputtering target and can be chosen to provide desired properties, such as conductivity, optical characteristics, adhesion, and the like.

PVD processes typically require a high vacuum environment to minimize gas interference and unwanted reactions, but achieving and maintaining a high vacuum environment can be technically demanding and expensive. Moreover, the presence of residual gases or contaminants can affect the quality and properties of the deposited films. Adequate seals are needed to maintain the vacuum integrity and prevent air or other gases from entering or escaping the vacuum chamber and disrupting the controlled environment, to minimize contamination of the system, to provide system stability in the accuracy and reliability of the processes performed in the high vacuum environment as well as to satisfy other considerations such as safety assurances and energy efficiency.

SUMMARY

The following presents a summary of this disclosure to provide a basic understanding of some aspects. This summary is intended to neither identify key or critical elements nor define any limitations of embodiments or claims. Furthermore, this summary may provide a simplified overview of some aspects that may be described in greater detail in other portions of this disclosure. Any of the described aspects may be isolated or combined with other described aspects without limitation to the same effect as if they had been described separately and in every possible combination explicitly.

Disclosed is a vacuum seal and seal system including a corresponding isolation ring and a corresponding sputtering target. The seal and seal system may be used in PVD sputter applications. In an embodiment, the seal and seal system does not incorporate an O-ring and corresponding groove or any vent slots or scallops, or other shapes or features having similar function. The seal may include a compressible portion and a rigid portion. The compressible portion may include two or more higher profile protrusions and two or more lower profile recesses that facilitate formation of a vacuum seal through compression by and between the isolation ring and the sputtering target. The rigid portion may be encapsulated by the same material as the compressible portion. The seal may further include a removable and replaceable plasma shield that is attachable to a first end of the seal. The seal may further include a rim on a second end that selectively interfaces with a corresponding step-out portion of the isolation ring. The sputtering target may have a continuous peripheral flange surface. In an embodiment, the seal and seal system is self-centering. In an embodiment, the seal and seal system provides an increased sealing surface or interface. In an embodiment, the seal and seal system provides a buffer between the sputtering target and the isolation ring.

In an exemplary embodiment of the invention, a sealing ring for a physical vapor deposition (PVD) vacuum chamber is disclosed having a compressible portion, wherein the compressible portion comprises at least one protrusion and at least one recess; a rigid portion adjacent the compressible portion, wherein the rigid portion has a rib that is substantially encapsulated by a secondary material; a rim that extends from a first surface of the sealing ring and is configured to selectively couple to an isolation ring; and a removable shield that is configured to selectively couple to a first end of the compressible portion and that is configured to isolate the compressible portion from an interior of a vacuum chamber.

In a further aspect, the compressible portion is made of a fluorocarbon, fluoroelastomer, and/or fluorine kautschuk material. In another aspect, the secondary material is a same material as the compressible portion and the rim. In an additional aspect, the at least one protrusion extends past the first surface and a second, opposite surface of the sealing ring. In a further aspect, the at least one recess terminates prior to the first surface and a second, opposite surface of the sealing ring. In an additional aspect, each of the at least one protrusion and each of the at least one recess alternate. In a further aspect, the compressible material and at least one recess are configured to entrap particulates.

In an additional aspect, the rib of the rigid portion is comprised of aluminum. In a further aspect, the compressible portion and the rigid portion are approximately the same length. In an additional aspect, the shield is configured to snap fit with the first end of the compressible portion. In a further aspect, the shield is configured to inhibit plasma arcing and thermal degradation of the compressible portion. In an additional aspect, the shield comprises polytetrafluoroethylene. In a further aspect, the rim further includes a plurality of retention tabs. In a further aspect, the sealing ring is configured to selectively interface with the isolation ring by an interference fit, thereby forming a seal between the sealing ring and isolation ring when installed in the PVD vacuum chamber.

In an additional aspect, the sealing ring is configured to self-center with the isolation ring using the plurality of retention tabs on the rim and a step-out portion of the isolation ring cut out of approximately 90 degrees. In a further aspect, a second surface of the sealing ring is configured to selectively interface with a sputtering target, thereby forming a seal between the sealing ring and sputtering target when installed in the PVD vacuum chamber. In an additional aspect, the sputtering target is devoid of any grooves, vent slots, and scallops and is configured to contact the sealing ring with a flat surface. In a further aspect, the sealing ring is configured to provide a buffer between the sputtering target and the isolation ring.

In yet another embodiment, a sputtering target is disclosed having a first surface configured to selectively interface to a sealing ring on a PVD vacuum chamber, wherein the first surface is devoid of any grooves, vent slots, and scallops and is configured to contact the sealing ring with a flat surface. In another aspect, the first surface is configured to be isolated from an isolation ring and wherein the isolation ring is configured to selectively interface with an opposite side of the sealing ring on the vacuum chamber, when installed in the PVD vacuum chamber. In a further aspect, In a further embodiment, an isolation ring is provided, which includes a first surface configured to selectively interface with a compressible portion and rigid portion of a sealing ring when installed in a PVD vacuum chamber, wherein the first surface is generally flat; and a step-out portion configured to selectively interface with a rim of the sealing ring when installed in a PVD vacuum chamber. In yet another aspect, the step-out portion has a cut out of approximately 90 degrees.

In an additional embodiment, a sealing kit for a vacuum chamber is provided, which includes, a sealing ring, wherein the sealing ring includes a compressible portion, a rigid portion adjacent the compressible portion, and a rim extending perpendicularly from the rigid portion. An isolation ring configured to selectively interface with a first mating surface of the isolation ring including the rim, wherein the isolation ring includes a cut out configured to selectively accommodate and contact the rim of the sealing ring, thereby forming a seal between the isolation ring and the sealing ring when installed in a PVD vacuum chamber. A sputtering target including a substantially planar first mating surface configured to selectively interface to a second mating surface of the sealing ring, thereby forming a seal between the sputtering target and the sealing ring when installed in a PVD vacuum chamber.

In another aspect, the first mating surface of the sputtering target is devoid of any O-ring grooves, vent slots, and scallops. In yet another aspect, the compressible portion comprises at least one protrusion and at least one recess, wherein each of the at least one protrusion and each of the at least one recess alternate. In a further aspect, a rib of the rigid portion is suspended in a same material that comprises the compressible material and the rim. In yet another aspect, the sealing ring further includes a plasma shield configured to attach to an inner perimeter side of the compressible portion.

In a further aspect, the sputtering target and the isolation ring each form a seal with the sealing ring. In another aspect, the sputtering target and the isolation ring are isolated from each other by the sealing ring.

In another embodiment, a method for assembling the sealing kit is provided, which includes, placing an isolation ring on a PVD vacuum chamber, wherein the isolation ring includes a step out on a mating surface; placing a sealing ring on the mating surface of the isolation ring, the sealing ring having a first mating surface and a second mating surface on an opposite side of the first mating surface, wherein the first mating surface of the sealing ring includes a rim configured to selectively couple to the step out of the isolation ring and wherein the first mating surface of the sealing ring contacts the mating surface of the isolation ring; placing a sputtering target on the second mating surface of the sealing ring, wherein the sealing ring includes a compressible portion and a shield, and wherein the sputtering target is configured to compress the compressible portion and the shield of the sealing ring; wherein the isolation ring and the sealing ring form a seal when installed in the PVD vacuum chamber, and the sealing ring and the sputtering target form a seal when installed in the PVD vacuum chamber. In a further aspect, the sputtering target and the isolation ring are isolated from each other by the sealing ring.

Also disclosed is a sealing kit for a physical vapor deposition (PVD) vacuum chamber, having a sealing ring for the PVD vacuum chamber having a compressible portion, wherein the compressible portion comprises at least one protrusion and at least one recess; a rigid portion adjacent the compressible portion, wherein the rigid portion has a rib that is substantially encapsulated by a secondary material; a rim that extends from a first surface of the sealing ring and is configured to selectively couple to an isolation ring; a removable shield that is configured to selectively couple to a first end of the compressible portion and that is configured to isolate the compressible portion from an interior of the vacuum chamber.

The isolation ring, having a first surface configured to selectively interface with the compressible portion and the rigid portion of the sealing ring when installed in the PVD vacuum chamber, wherein the first surface is generally flat; a step-out portion configured to selectively interface with the rim of the sealing ring when installed in the PVD vacuum chamber. The sputtering target having a first surface with a peripheral flange surface configured to interface with the sealing ring, when installed in the PVD vacuum chamber, wherein the peripheral flange surface of the first surface is devoid of any O-ring grooves, vent slots, and scallops and is configured to contact the sealing ring with a flat surface.

The following description and the drawings disclose various illustrative aspects. Some improvements and novel aspects may be expressly identified, while others may be apparent from the description and drawings.

BRIEF DESCRIPTION OF THE DRAWINGS

The present teachings may be better understood by reference to the following detailed description taken in connection with the following illustrations, in which like reference characters refer to like parts throughout, wherein:

FIGS. 2A-F shows examples of arcing events, oxidation, nodule formation, abrasion, and redeposition that can occur with the conventional vacuum chambers and seals of FIGS. 1A-C;

Figure 1A:
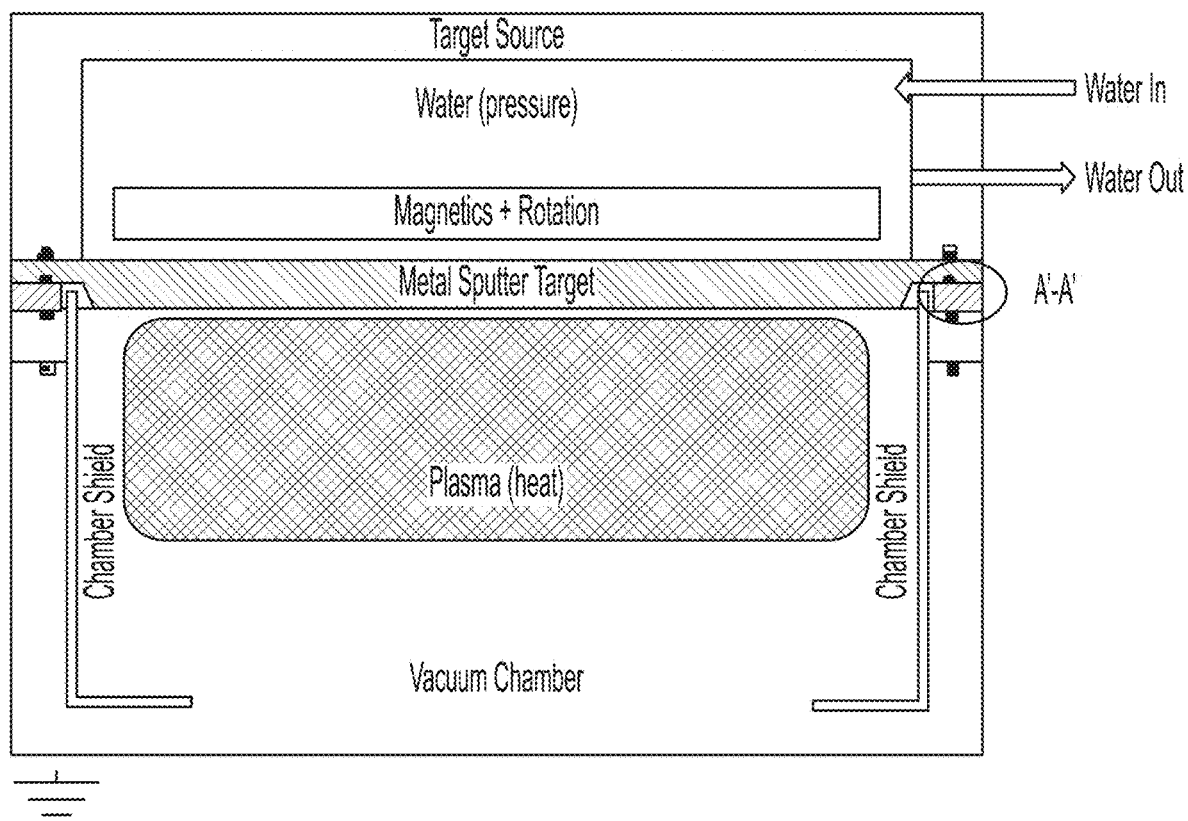
FIG. 1A shows an embodiment of a conventional vacuum chamber and seal comprising an O-ring inserted into a dovetail groove machined into a sputtering target.
Figure 1B:
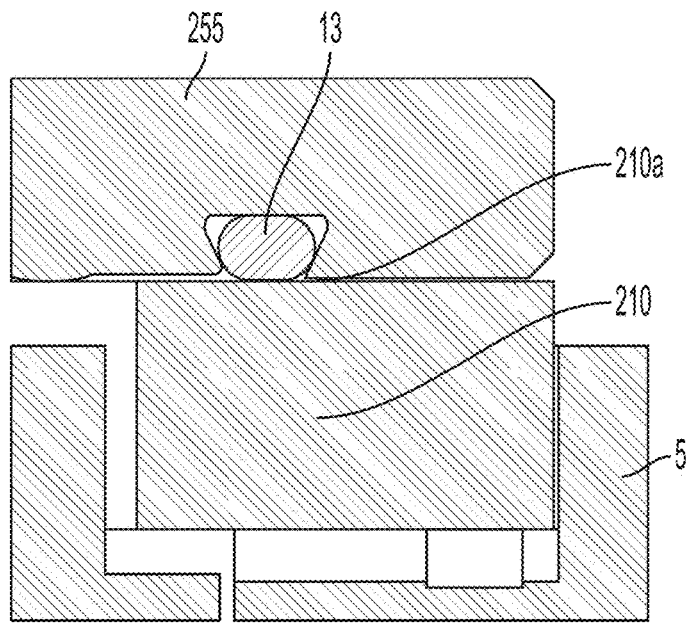
FIG. 1B shows an enlarged view of the conventional vacuum chamber and seal in FIG. 1A comprising an O-ring inserted into a dovetail groove machined into a sputtering target.
Figure 1F:
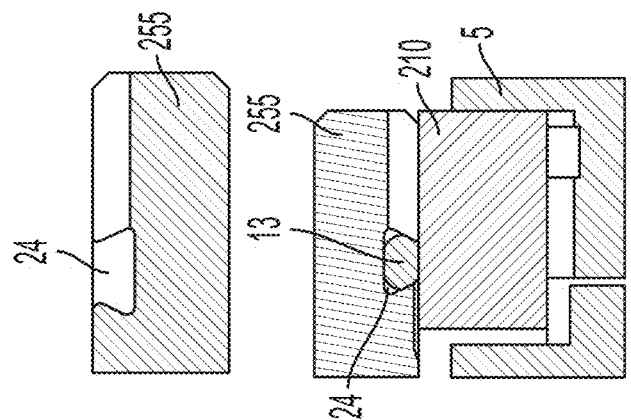
FIGS. 1C-F shows embodiments of a conventional vacuum chamber and seal comprising an O-ring inserted into a dovetail groove machined into a sputtering target and further including an inner vent slot (i), scallop slot (ii), cross gland vent slot (iii), and outer vent slot (iv)
Figure 1E:
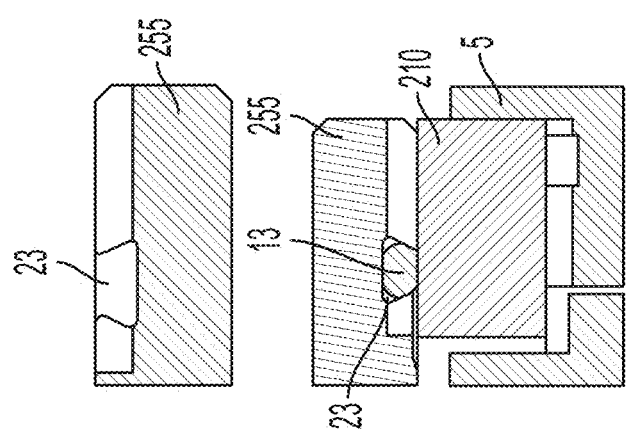
Figure 1D:
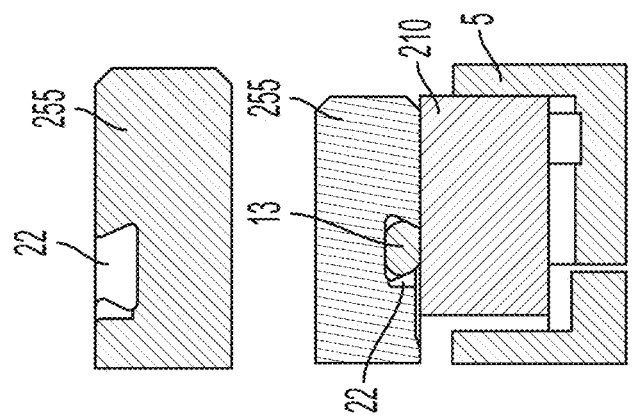
Figure 1C:
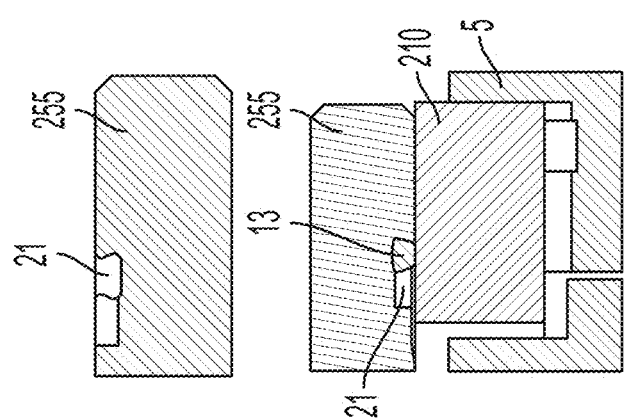

The invention may be embodied in several forms without departing from its spirit or essential characteristics. The scope of the invention is defined in the appended claims, rather than in the specific description preceding them. All embodiments that fall within the meaning and range of equivalency of the claims are therefore intended to be embraced by the claims.

DETAILED DESCRIPTION

Reference will now be made in detail to exemplary embodiments of the present teachings, examples of which are illustrated in the accompanying drawings, wherein like numbered aspects refer to a common feature throughout. It is to be understood that other embodiments may be utilized and structural and functional changes may be made without departing from the respective scope of the present teachings. Moreover, features of the various embodiments may be combined or altered without departing from the scope of the present teachings. As such, the following description is presented by way of illustration only and should not limit in any way the various alternatives and modifications that may be made to the illustrated embodiments and still be within the spirit and scope of the present teachings.

In this disclosure, numerous specific details provide a thorough understanding of the subject disclosure. It should be understood that aspects of this disclosure may be practiced with other embodiments not necessarily including all aspects described herein, etc.

As used herein, the words "example" and "exemplary" means an instance, or illustration. The words "example" or "exemplary" do not indicate a key or preferred aspect or embodiment. The word "or" is intended to be inclusive rather than exclusive, unless context suggests otherwise. As an example, the phrase "A employs B or C," includes any inclusive permutation (e.g., A employs B; A employs C; or A employs both B and C). As another matter, the articles "a" and "an" are generally intended to mean "one or more" unless context suggest otherwise.

Further, unless context suggest otherwise, descriptions of shapes (e.g., circular, rectangular, triangular, etc.) refer to shapes meeting the definition of such shapes and general representation of such shapes. For instance, a triangular shape or generally triangular shape may include a shape that has three sides and three vertices or a shape that generally represents a triangle, such as a shape having three major sides that may or may not have straight edges, triangular like shapes with rounded vertices, etc.

Disclosed is a vacuum seal and seal system including a corresponding isolation ring and a corresponding sputtering target. The seal and seal system may be used in PVD sputter applications. PVD sputter applications utilize a sputtering target to provide a material transfer under vacuum conditions. The material from the sputtering target may be vaporized by bombarding the sputtering target with high-energy particles and the vaporized material may be deposited onto a substrate surface as a thin film layer. The sputtering target may be consumed during this process.

For semiconductor applications, in an example, the sputtering target may be a suitable material for vaporization and deposition on a substrate, such as, but not limited to, copper.

The vacuum chamber may be used to vaporize the material from the sputtering target and deposit the material onto the substrate, such as a forming copper traces on a wafer. The material transferring from the sputtering target to the substrate can be used to create conductive paths, insulating layers, or provide barrier properties, and may otherwise be used to fabricate a circuit board or other electrical component. The vacuum conditions and seal between the sputtering target and the vacuum chamber are useful to carry out PVD and to provide a viable end product.

As shown in FIGS. 1A-F, conventional sealing in PVD sputtering processes may generally comprise an O-ring 13 inserted into a O-ring groove, such as, but not limited to, a dovetail groove, that is machined into a flange of the sputtering target 255. Such O-rings can twist and turn within the groove during assembly and PVD processes, resulting in an inadequate and unreliable seal of the vacuum chamber 5 over the life and use of the sputtering target 255 and before the sputtering target 255 is consumed. Additionally, the flange of the sputtering target 255 may generally include vent slots and/or scallops that cross the seal surface, or other shapes with similar function, see FIG. 1C-1F showing examples of an inner vent slot 21, scallop slot 22, cross gland vent slot 23, and outer vent slot 24.

These conventional features, however, can weaken the flange of the sputtering target 255 and provide sources of leakage between atmosphere and the sputter environment within the vacuum chamber 5, especially under elevated and sustained pressures. As sputtering targets are consumed and mass is reduced, the physical properties of the assembly may also be compromised. Arcing events, oxidation, nodule formation, degradation, abrasion, redeposition, and particle generation often occur near or adjacent the O-ring seal, vent slots, and/or scallops, see FIGS. 2A-F for example, and can lead to inefficiency and failure in the system seal. Additionally, the single O-ring 13, relying on a single and discrete point of contact, can result in a single point fulcrum effect with the bottom contact surface 15a of isolation ring 15 during dynamic cycling of the sputtering target (A), which, in turn, causes in a single point of stress providing a seal that may be susceptible wear and malfunction.

There is a need for improved vacuum sealing mechanisms for vacuum chambers and sputter applications. There is a need for an improved vacuum seal that provides one or more (or all) of the following: prevents leakage and maintains a vacuum seal over the life and use of a sputtering target; minimizes or prevents arcing events, oxidation, nodule formation, degradation, abrasion, redeposition, and/or particle generation (and associated failure of PVD due to these events) over the life and use of a sputtering target; is not susceptible to variations or fluctuations in use (e.g., twisting); provides consistent application and stabilization of the components; achieves self-leveling and self-centering during assembly; minimizes or eliminates vent slots and/or scallops; minimizes or eliminates grooves in the sputtering target surface; eliminates the single point fulcrum effect of conventional systems; provides an increased sealing surface or interface; incorporates an intrinsic occlusion mechanism to trap and eliminate potential particles from entering the vacuum chamber that can occur during dynamic cycling; includes an integral plasma shield to protect the seal from high energy ionized gas (plasma) attack and thermal degradation; provides a buffer between the sputtering target and the isolation ring; and the like.

In an embodiment, the seal and seal system eliminates the requirement for an O-ring and corresponding groove or any vent slots or scallops in the sputtering target, such as a backing plate in a non-monolithic sputtering target or flange of a monolithic sputtering target. The sputtering target may have a continuous peripheral flange surface. In an embodiment, the seal and seal system is self-centering. In an embodiment, the seal and seal system provides an increased sealing surface or interface. In an embodiment, the seal and seal system provides a buffer between the sputtering target and the isolation ring.

The disclosed seal and seal system may provide one or more (or all) of the following: prevents leakage and maintains a vacuum seal over the life and use of a sputtering target; minimizes or prevents arcing events, oxidation, nodule formation, degradation, abrasion, redeposition, and/or particle generation (and associated failure of PVD due to these events) over the life and use of a sputtering target; is not susceptible to variations or fluctuations in use (e.g., twisting); provides consistent application and stabilization of the components; achieves self-leveling and self-centering during assembly; minimizes or eliminates vent slots and/or scallops; minimizes or eliminates grooves in the sputtering target surface; eliminates the single point fulcrum effect of conventional systems; provides an increased sealing surface or interface; incorporates an intrinsic occlusion mechanism to trap and eliminate potential particles from entering the vacuum chamber that can occur during dynamic cycling; includes an integral plasma shield to protect the seal from high energy ionized gas (plasma) attack and thermal degradation; provides a buffer between the sputtering target and the isolation ring; and the like.

Turning to FIG. 3-6, shown is a sealing ring 100 that may be used as part of a sealing system 400, including a corresponding isolation ring 210 and/or a corresponding sputtering target 255. Isolation ring 210 may selectively interface with a vacuum chamber 5. Sealing ring 100 may selectively interface with isolation ring 210. Sputtering target 255 may selectively interface with sealing ring 100. The assembly of isolation ring 210, sealing ring 100, and sputtering target 255 (comprising sealing system 400) onto vacuum chamber 5 may provide a vacuum seal between sputtering target 255 and vacuum chamber 5, enabling PVD processes to be performed while containing plasma within the vacuum chamber 5.

Figure 9A:
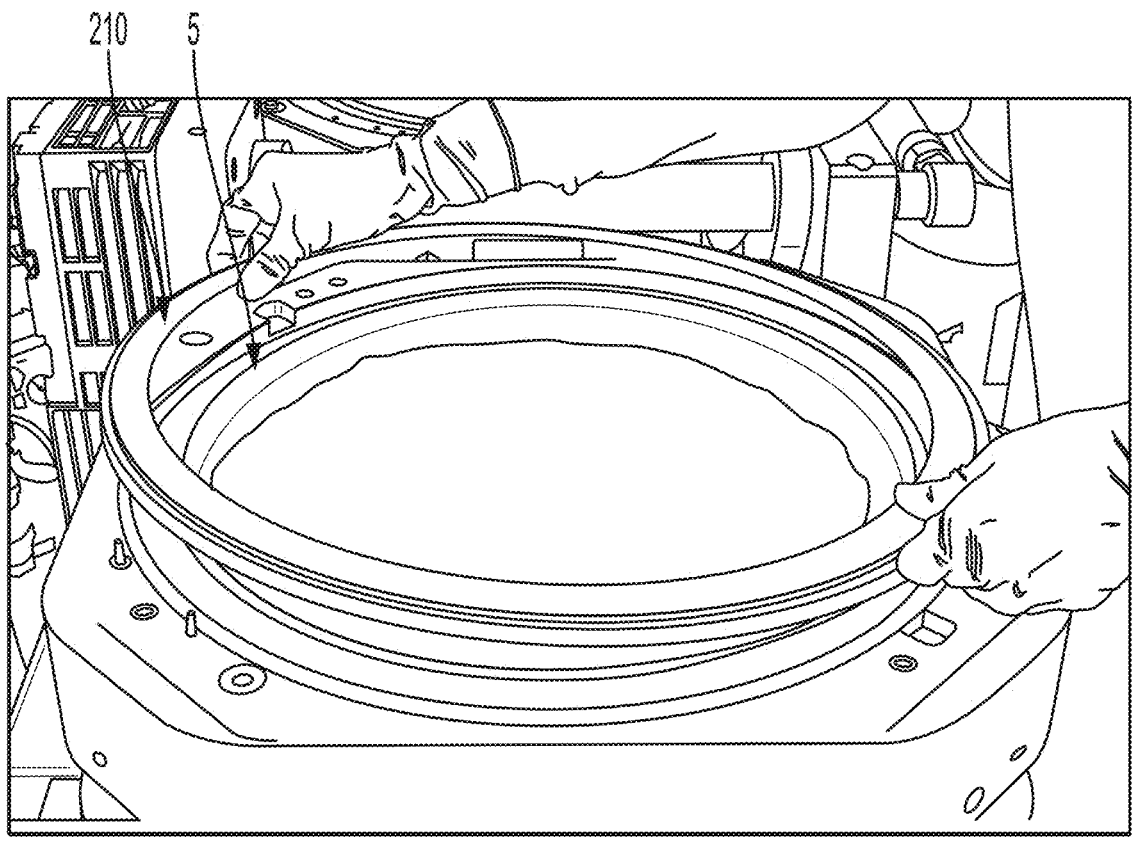
FIGS. 9A-B show embodiments of an isolation ring as assembled on a vacuum chamber in accordance with aspects disclosed herein.
Figure 9B:
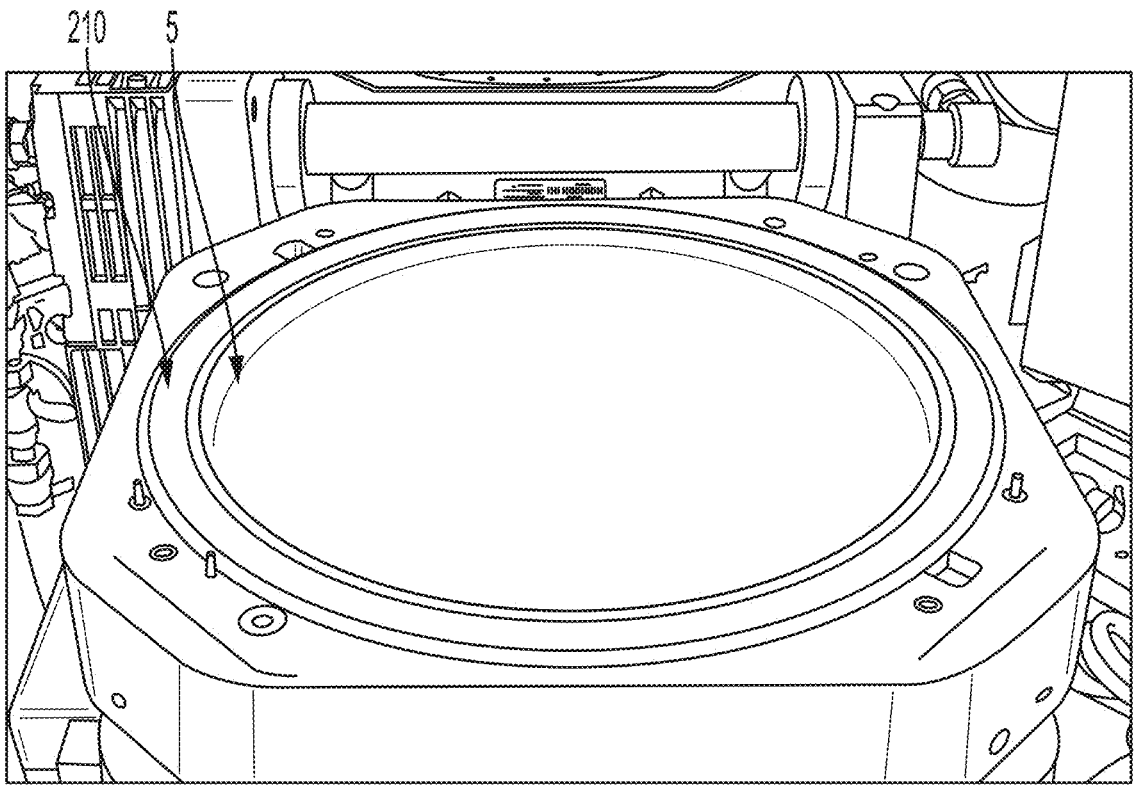
Figure 10A:
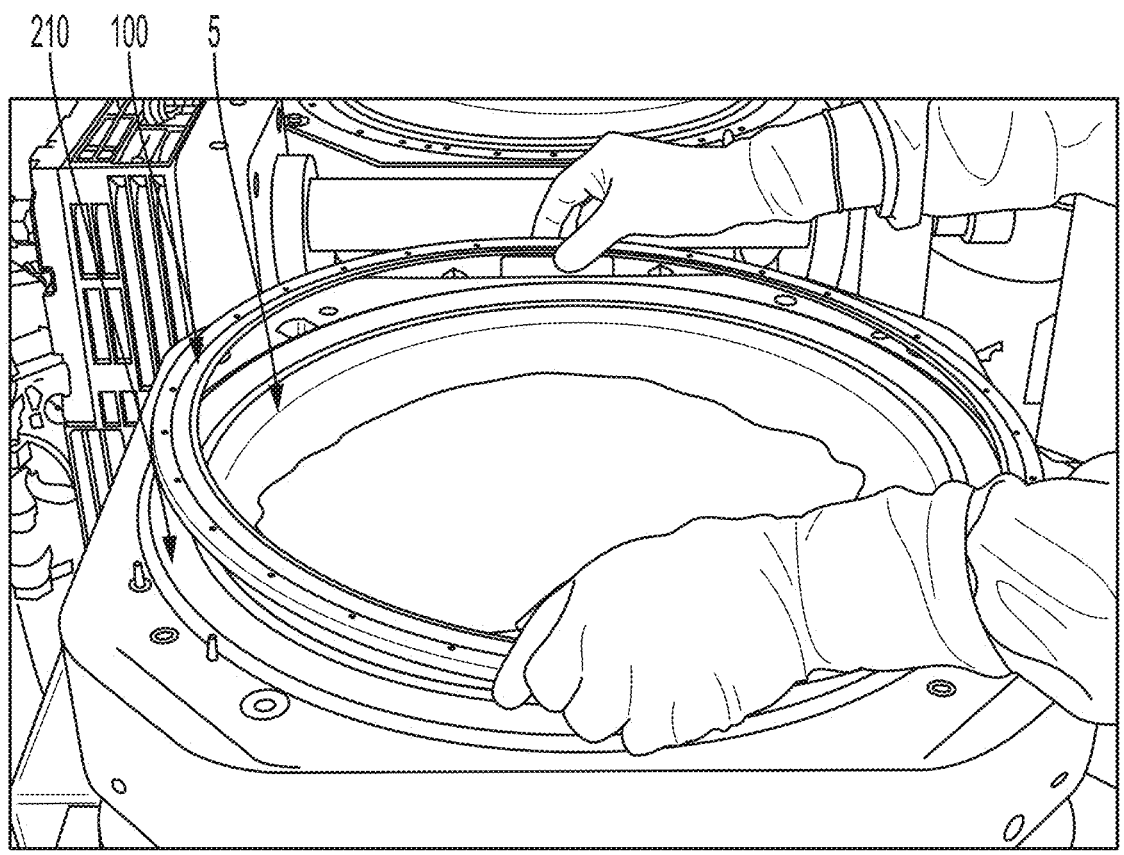
FIGS. 10A-B show embodiments of a seal as assembled on an isolation ring and vacuum chamber in accordance with aspects disclosed herein.
Figure 10B:
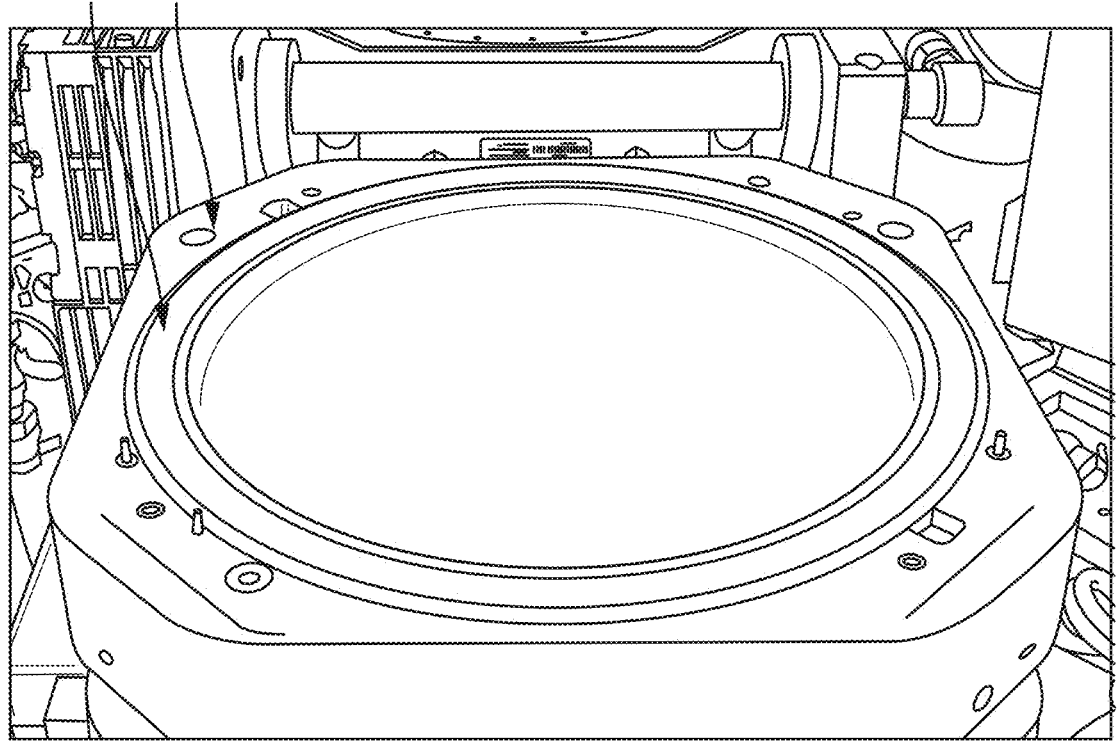
Figure 11:
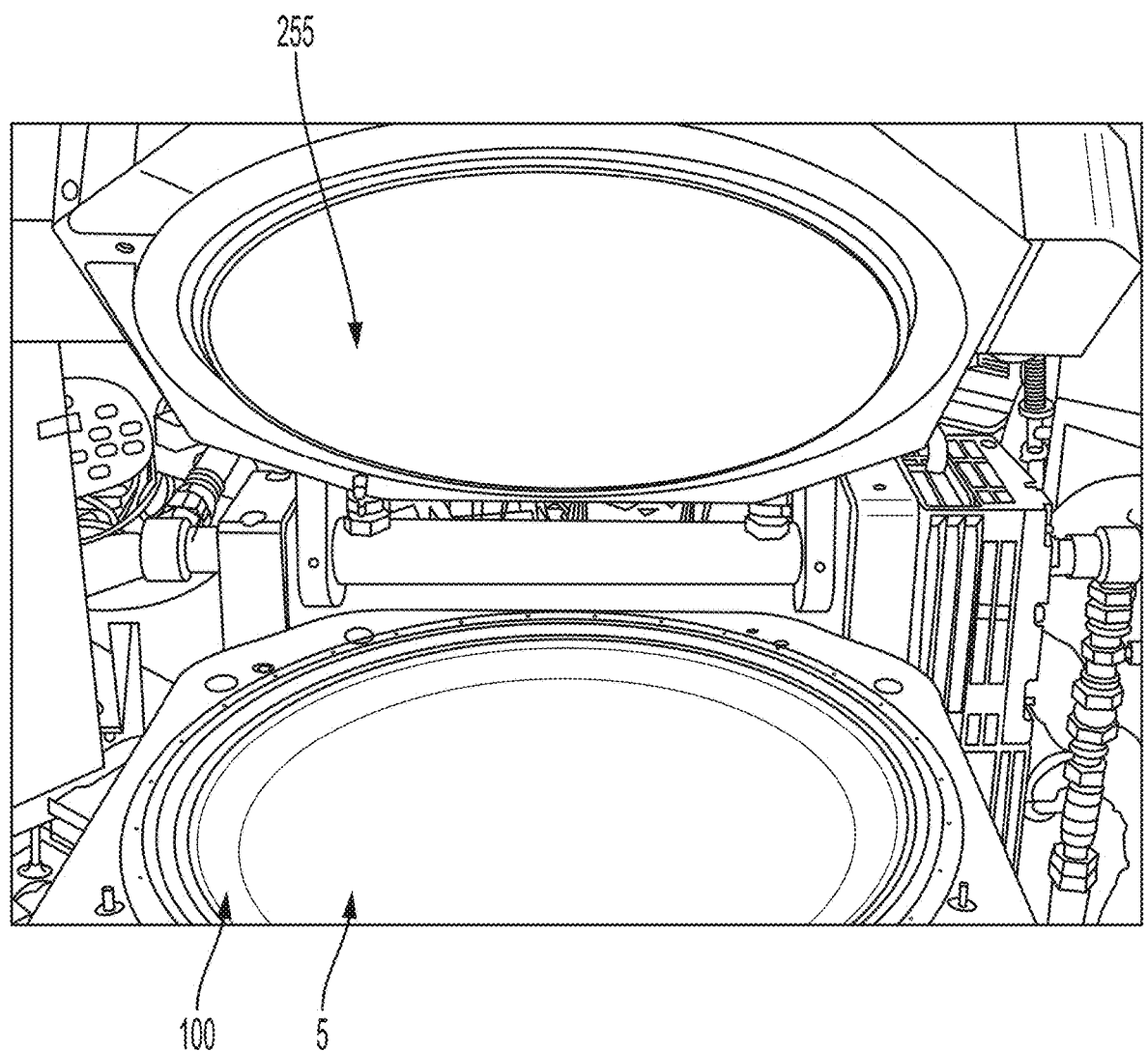
FIG. 11 shows an embodiment of a sputtering target to be assembled on a seal, isolation ring, and vacuum chamber in accordance with aspects disclosed herein.
Figure 12A:
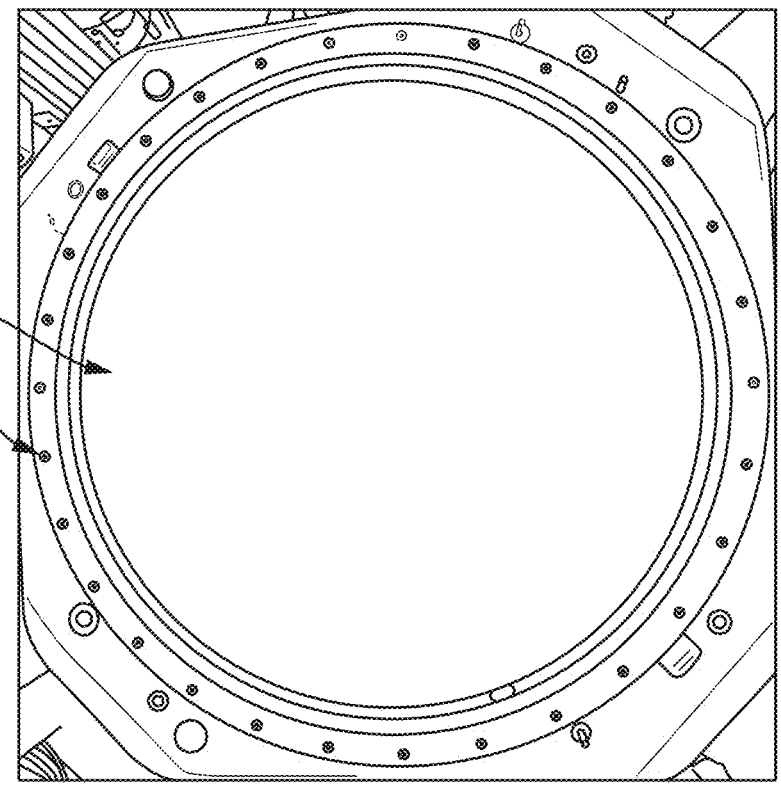
FIG. 12A shows an embodiment of a vacuum chamber in accordance with aspects disclosed herein and FIG. 12B shows an embodiment of a sputtering target in accordance with aspects disclosed herein.
Figure 12B:
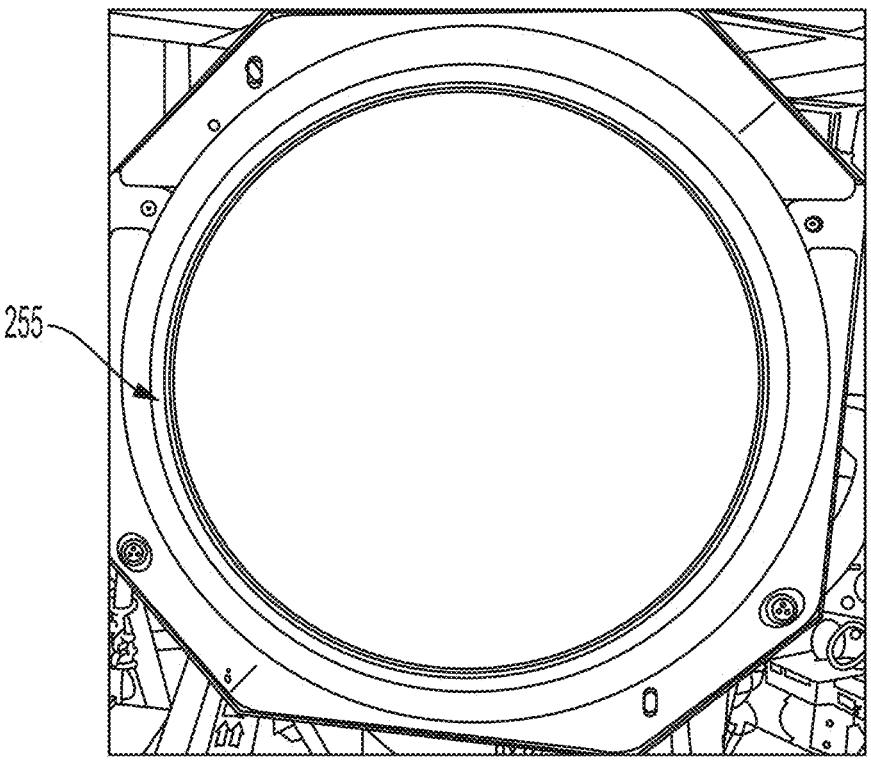
Figure 13A:
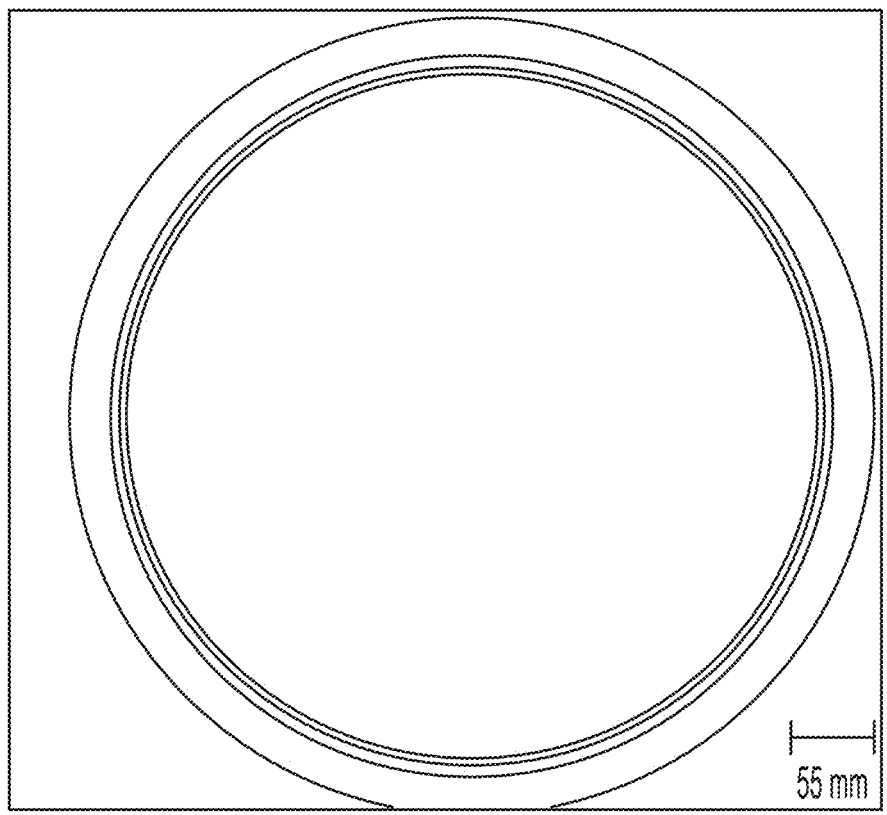
FIGS. 13A-B shows examples of an after-life sputtering target using the described seal and sealing systems in accordance with aspects disclosed herein.
Figure 13B:
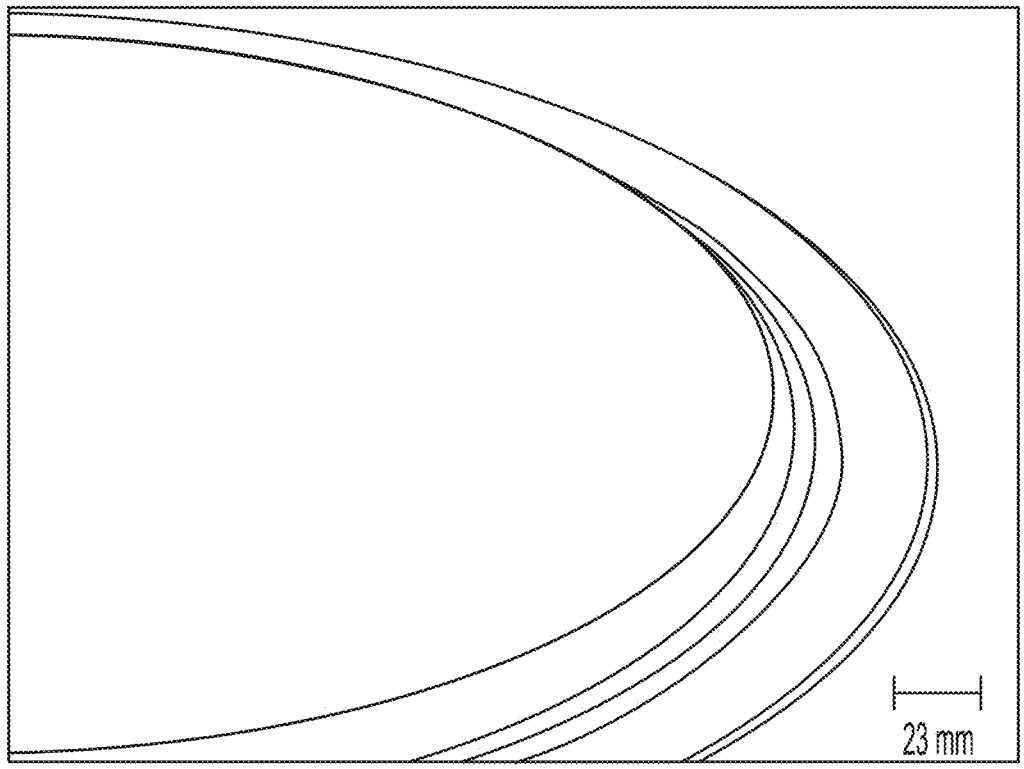
Figures 14A, 14B, 14C, 14D:
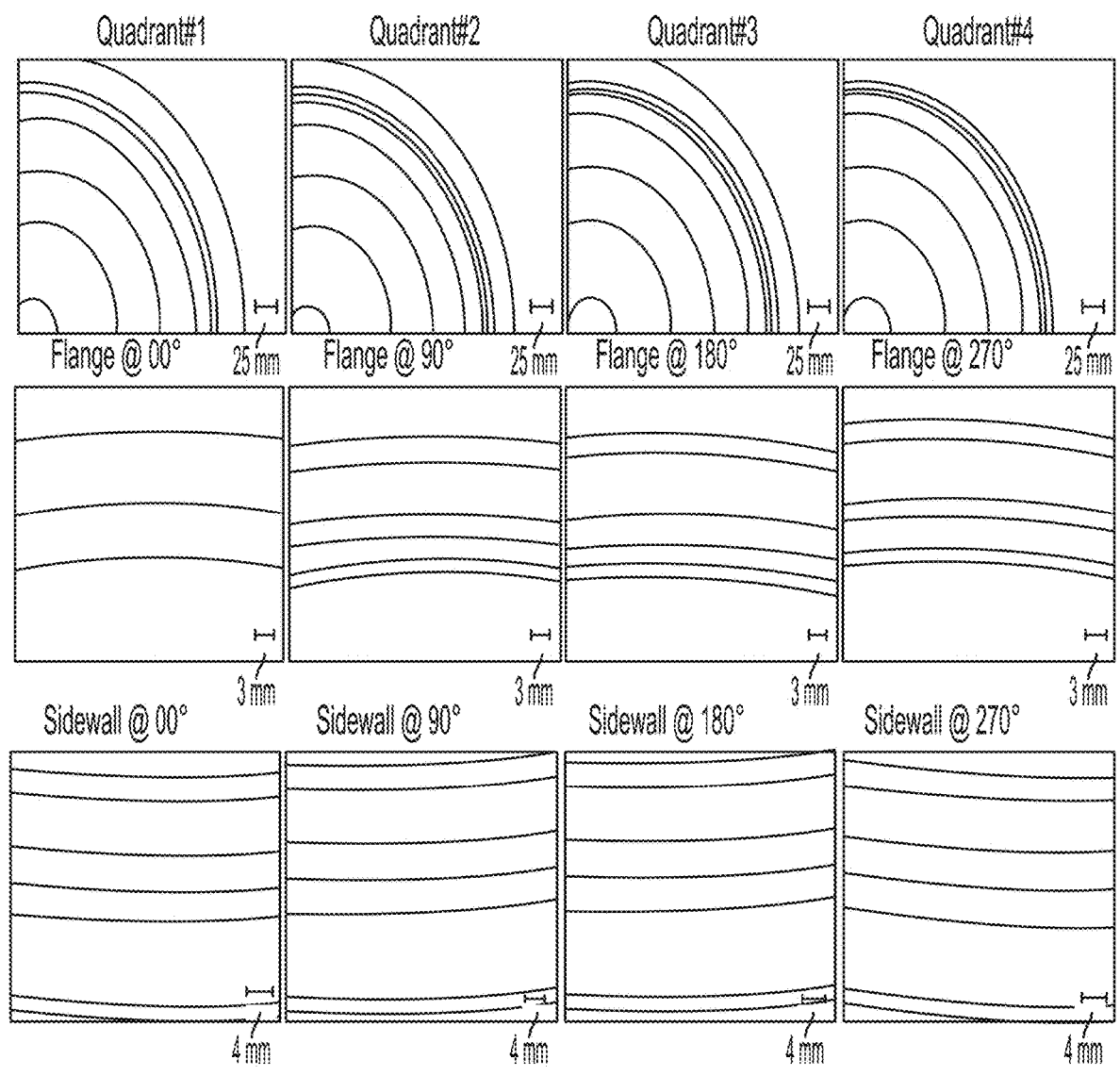
FIGS. 14A-D shows examples of an after-life sputtering target using the described seal and sealing systems in accordance with aspects disclosed herein.

FIGS. 9-11, for example, show assembly of the isolation ring 210 onto vacuum chamber 5, followed by assembly of sealing ring 100 onto isolation ring 210, followed by assembly of sputtering target 255 onto sealing ring 100. In an embodiment, each of the sealing ring 100, isolation ring 210, and sputtering target 255 may be generally concentric and sized and shaped to fit onto the vacuum chamber, such as vacuum chamber 5. In an embodiment, each of the sealing ring 100, isolation ring 210, and sputtering target 255 may be attached with an interference or friction fit. It is noted that other attachment mechanisms may also be used. Assembly of the sealing ring 100, isolation ring 210, and sputtering target 255 may be fast, e.g., achieved in under 5 minutes, in under 1 minute, in under 30 seconds, etc. Components of the sealing ring 100, isolation ring 210, and sputtering target 255, such as rim portion 140 with retention tabs 144, and the like, may facilitate fast assembly and features such as self-centering and self-leveling.

Sealing ring 100 may generally include a planar portion 148 and a rim portion 140. The planar portion 148 having a first side (or surface) 102 and a second side (or surface) 104. In an embodiment, first side 102 of sealing ring 100 may be understood as an isolation ring facing side that may be selectively coupled with a corresponding side of isolation ring 210. In an embodiment, second side 104 of sealing ring 100 may be understood as a sputtering target facing side that may be selectively interfaced with a corresponding side of sputtering target 255. It is noted that first side 102 may also be referred to as an underside of sealing ring 100 and second side 104 may also be referred to as a top side of sealing ring 100. When assembled, the first side (or surface) 102 may contact (interface with) isolation ring 210 and second side (or surface) 104 may contact (interface with) sputtering target 255. In an embodiment, sealing ring 100 may serve as a buffer and separation between isolation ring 210 and sputtering target 255 so that isolation ring 210 and sputtering target 255 do not make contact with one another when assembled in vacuum chamber 5.

Planar portion 148 of sealing ring 100 may include a compressible portion 110 that extends towards a center of the sealing ring 100. In an embodiment, compressible portion 110 may include one or more higher profile protrusions that extend away from a horizontal axis 150 of the sealing ring 100, e.g., protrusions 113. The planar portion 148 includes a horizontal axis 150. In an embodiment, the horizontal axis 150 that is located midway between the peak of the protrusions 113 on the first side 102 and the peak of the protrusions 113 on the second side 104, and one or more lower profile recesses that narrow toward a horizontal axis 150 of the sealing ring 100, e.g., recess 116. In an embodiment, compressible portion 110 may include two or more higher profile protrusions 113. For example, compressible portion 110 may include 1, 2, 3, 4, 5, 6, 7, 8, 9, 10, 15, 20, etc., higher profile protrusions 113. In an embodiment, compressible portion 110 may include two or more lower profile recesses 116. For example, compressible portion 110 may include 1, 2, 3, 4, 5, 6, 7, 8, 9, 10, 15, 20, etc., lower profile recesses 116. Protrusions 113 and recesses 116 may alternate. In an embodiment, compressible portion 110 may include n protrusions 113 and n−1 recesses 116. For example, compressible portion 110 may include two protrusions 113 and one recess 116. The one recess 116 may be positioned in between the two protrusions 113. In an embodiment, compressible portion 110 may include n protrusions 113 and n+1 recesses 116. For example, compressible portion 110 may include two protrusions 113 and three recess 116. One recess 116 may be positioned in between the two protrusions 113 and each of the other two recesses 116 may be positioned on the other side of each protrusions 113, so that the resulting pattern resembles recess, protrusion, recess, protrusion, recess. It is noted that other quantities, positions, and patterns of protrusions 113 and recesses 116 may also be used in compressible portion 110.

In an embodiment, protrusions 113 may extend beyond the rest of the profile of the sealing ring 100 on the second side 104. Stated alternatively, protrusions 113 may extend further away from the horizontal axis 150 than any other feature on first side 102 of the sealing ring 100. Further, protrusions 113 may extend beyond the rest of the profile of the sealing ring 100 on the first side 102, except for the rim portion 140. Stated alternatively, protrusions 113 may extend further away from the horizontal axis 150 than any other feature on second side 104 of the sealing ring 100, except for the rim portion 140. rim portion 140. In an exemplary embodiment, protrusions 113 may have a greater height or diameter than the rest of the profile of the sealing ring 100 (not including rim portion 140). In an embodiment, recess 116 may terminate before the rest of the profile of the sealing ring 100. In an embodiment, recess 116 may have a smaller height or diameter than the rest of the profile of the sealing ring 100. In an exemplary embodiment, protrusions 113 may extend past first surface 102. In an exemplary embodiment, protrusions 113 may extend past second surface 104. In an exemplary embodiment, protrusions 113 may extend past both first surface 102 and second surface 104. In an exemplary embodiment, protrusions 113 may be generally rounded or circular. It is noted that other shapes may also be used unless context or this disclosure suggest otherwise. In an exemplary embodiment, recesses 116 may terminate before first surface 102. In an example, recesses 116 may terminate before second surface 104. In an exemplary embodiment, recesses 116 may terminate before both first surface 102 and second surface 104. Further, in an exemplary embodiment, recesses 116 may extend below first surface 102 toward the horizontal axis 150 of sealing ring 100. In an exemplary embodiment, recesses 116 may terminate below the second surface 104 toward the horizontal axis 150 of sealing ring 100. In an exemplary embodiment, recesses 116 may terminate below both first surface 102 and second surface 104 toward the horizontal axis 150 of sealing ring 100. In an exemplary embodiment, recesses 116 may be generally rounded or concaved. It is noted that other shapes may also be used unless context or this disclosure suggest otherwise.

Compressible portion 110 may comprise any compressible material or combination of materials as may be desired or suitable for a particular purpose or intended application. In an embodiment, compressible portion 110 may comprise a fluorocarbon, fluoroelastomer, or fluorine kautschuk material (FKM) composition. Materials may be selected based on their durometer, in an example. Materials may be selected based on their compressibility and/or resilience, in an example. Materials may be selected based on their heat resistance, in an example. Other materials may include, but are not limited to, polymers such as polyurethane, ethylene propylene diene monomer, styrene-butadiene rubber, thermoplastic elastomers, and the like, other natural rubbers or silicone rubbers, neoprene, expanded polytetrafluoroethylene, foam materials such as polyurethane foam, combinations of two or more thereof, and the like.

Protrusions 113 may serve as contact or compression points that selectively contact a corresponding surface of the isolation ring 210 and/or a corresponding surface of the sputtering target 255 wherein the corresponding surface of the isolation ring 210 and/or the corresponding surface of the sputtering target 255 selectively compress the protrusions 113 until the corresponding surface of the isolation ring 210 and/or the corresponding surface of the sputtering target 255 contact the remaining body portion of sealing ring 100 (e.g., rigid portion 130, shield 190, etc.). Recesses 116 may generally provide clearance for the compressed protrusions 113 and enable the protrusions 113 to be compressed into recesses 116 to achieve a vacuum seal. The compressible portion 110 may generally facilitate formation of a vacuum seal through compression of the protrusions 113 by and between the isolation ring 210 and/or the sputtering target 255.

Sealing ring 100 may provide a radially concentric seal that enables separation of high vacuum (sputter) environment, e.g., within vacuum chamber 5 where sputtering occurs, from atmosphere during dynamic cycling that occurs throughout PVD processes.

In an embodiment, the greater or longer the compressible portion 110 extends toward the center of the sealing ring 100 and the more protrusions 113 or contact points, the greater contact area. Protrusions 113 may be semi-circle in shape. The greater contact area may provide a greater longevity of the vacuum seal and may provide additional rigidity and structure to the sealing ring 100. Multiple contact points, e.g., multiple protrusions 113, may provide duplicity in the vacuum seal so that the vacuum seal may be sustained and may not be as susceptible to weaknesses such as leakage during the use and life of the sputtering target 255. In an exemplary embodiment, protrusions 113 may be spaced apart by about 0.150". Stated alternatively, a vertical axis 113a of each of the consecutive protrusions 113 may be spaced apart by about 0.150", when measured along horizontal axis 150, such as when travelling along the horizontal axis 150 from outside wall 147 to the center of the sealing ring 100. Each of the protrusions 113a having a vertical axis 113a. Further, in an exemplary embodiment, the inner most protrusion 113 (protrusion closest to the center of the sealing ring 100) may be located about 0.255" from the tip 190a of the shield 190. Further, in an exemplary embodiment, the inner most protrusion 113 (protrusion closest to the center of the sealing ring 100) may be located about 0.255" from the inner diameter of the shield 190. In an exemplary embodiment, protrusion 113 may have a height of about 0.114"-0.124", when measured from a top 113b to a bottom 113c of a protrusion 113 in a vertical direction along vertical axis 113a.

Additionally, multiple contact points, e.g., multiple protrusions 113, may provide occlusion mechanisms that entrap gases and particulate within the annulus of sealing ring 100 and compressible portion 110 while allowing sufficiently high contact forces to form the vacuum seal. Sealing ring 100 may increase contact areas on a flange portion of the sputtering target 255 while allowing sufficient contact forces on the sealing ring 100 that can help reduce sputtering target flange movement through life of the sputtering target 255. In an embodiment, flat gasket type seals can require impractical contact forces to seal that vacuum forces alone will not provide.

Sealing ring 100 may further comprise a rigid portion 130. In an embodiment, rigid portion 130 may be positioned adjacent compressible portion 110. In an embodiment, rigid portion 130 may be positioned further away from the center of sealing ring 100 (e.g., toward an ambient environment), when compared to the position of the compressible portion 110, which is positioned closer to the center of the sealing ring 100, when compared to the position of the rigid portion 130 (e.g., toward an interior of vacuum chamber 5).

Rigid portion 130 may be more rigid than compressible portion 110. A rib 131 may be present in rigid portion to provide rigidity. Rib 131 may comprise any rigid material or combination of materials as may be desired or suitable for a particular purpose or intended application. In an embodiment, rib 131 may comprise aluminum. It is noted that any other non-magnetic materials with appropriate mechanical properties may also be used. Materials may be selected based on their durometer, in an example. Materials may be selected based on their rigidity, non-magnetic properties, conductive properties, and the like, in an example. Other materials may include, but are not limited to, certain grades of stainless steel, titanium, brass, carbon fiber reinforced polymers, ceramics such as alumina and zirconia, fiberglass, and the like.

Rib 131 of rigid portion 130 may be encapsulated by or suspended within the same material as the compressible portion 110. Rib 131 may be encapsulated by or suspended within a similar material as the compressible portion 110. Rib 131 may be fully encapsulated by a compressible material. Rib 131 may be substantially encapsulated by a compressible material. Rib 131 may be partially encapsulated by a compressible material. A horizontal axis of the rigid portion 130 may be located along a horizontal axis 150 of the sealing ring 100. Further, a horizontal axis of rib 131 may be located along a horizontal axis 150 of the sealing ring 100. For example, rib 131 may be fully encapsulated by a compressible material except for several cutouts or apertures 120 that are used to suspend rib 131 in a mold to apply the compressible material thereon. In an embodiment, rib 131 may be exposed through the cutouts or apertures 120 in the compressible material in the rigid portion 130. The coating or encapsulation may prevent or minimize arcing between rigid portion 130 and sputtering target 255. In an embodiment, the thickness of the coating or encapsulation at rigid portion 130 (on each side above and below rib 131) may be about 0.084"-0.096". In other embodiments, the thickness of the coating or encapsulation at the rigid portion may be about 0.080"-0.010". In further exemplary embodiments, the thickness of the coating or encapsulation at the rigid portion may be about 0.076"-0.014".

In other embodiments, the thickness of the coating or encapsulation at rigid portion 130 (on each side above and below the rib 131) may be about 0.014". In other embodiments, the thickness of the coating or encapsulation at rigid portion 130 between a top surface 131a of the rib 131 and second side 104 may be about 0.014" and the thickness of the coating or encapsulation at rigid portion 130 between a bottom surface 131b of the rib 131 and first side 102 may be about 013". In another exemplary embodiment, the thickness of the coating or encapsulation at rigid portion 130 between the bottom surface 131b of the rib 131 and first side 102 may be about 0.008"-0.018". In other embodiments, the thickness of the coating or encapsulation between a rear surface 131d of the rib 131 and the second end 108 of the sealing ring 100 may be about 0.07". The coating or encapsulation may prevent or minimize abrasion from the isolation ring 210 and/or sputtering target 255. In an embodiment, rigid portion 130 may be approximately the same size in width relative compressible portion 110. In an embodiment, rigid portion 130 may be smaller in length than compressible portion 110. In an embodiment, rigid portion 130 may be larger in length than compressible portion 110. The rib 131 may have a thickness of 0.063" (distance between the top surface 131a and bottom surface 131b of the rib portion 131). The rib 131 may also have a width of about 0.45" (distance between the inner surface 131c and the outer surface 131d along the horizontal cross-section of rigid portion 130 (or rib 131), stated alternatively, along the horizontal axis 150).

Rigid portion 130 may provide support, rigidity, and/or stability to sealing ring 100. Rigid portion 130 may provide strength to sealing ring 100 during dynamic sputter cycling and may help to eliminate excessive flange sputtering target 255 to isolation ring 210 movement. Rigid portion 130 may eliminate or minimize mechanical abrasion and particle generation resulting from proximity movements from the flange of sputtering target 255 (flange of backing plate 260 of sputtering target 255 of non-monolithic target or peripheral flange of monolithic sputtering target 255) and isolation ring 210. In an exemplary embodiment, the inner diameter of the rib 131 measured from the inner surface 131c of the rib 131 may be about 19.57"-19.63" and the outer diameter of the rib 131 measured from the outer surface 131d of the rib 131 may be about 20.47"-20.53".

Sealing ring 100 may generally include a first end 106 and a second end 108. In an embodiment, first end 106 may be an inner perimeter end of sealing ring 100 located toward a center of the sealing ring 100. In an embodiment, second end 108 may be an outer perimeter end of sealing ring 100 located opposite of the first end 106 and away from a center of the sealing ring 100. First end 106 may extend from the compressible portion 110 toward the center of the sealing ring 100. First end 106 may be attached to and positioned adjacent the compressible portion 110 of sealing ring 100. First end 106 may comprise the same or similar material as compressible portion 110. In an embodiment, compressible portion 110 may be positioned between rigid portion 130 and first end 106. First end 106 may be configured to selectively receive a shield 190. Shield 190 may be configured to cover all or at least a portion of first end 106. Shield 190 may be configured to isolate and protect compressible portion 110 and the rest of sealing ring 100 from the vacuum environment in vacuum chamber 5, such as providing protection from the plasma in vacuum chamber 5. Shield 190 may be selectively removable from compressible portion 110 sealing ring 100 and may be replaceable. First end 106 may be configured to selectively receive a shield 190 with a snap-fit engagement. It is noted that other connection mechanisms may also be utilized as may be desired or suitable for a particular purpose or intended application. In an embodiment, first end 106 of sealing ring 100 may be tapered. In an embodiment, first end 106 of sealing ring 100 may be referred to as a c-shape. In an embodiment, first end 106 of sealing ring 100 may be referred to as a snake-head shape. In an example, first end 106 of sealing ring 100 may include a ramp up portion having a gradual increase in slope and a slot. In an example, shield 190 may include a hollow portion generally sized and shaped to correspond to the tapered or snake-head shape of the first end 106 of sealing ring 100 and a snap finger that is configured to insert into slot. Snap finger may be inserted over the ramp up portion having a gradual increase in slope of the first end 106 of sealing ring 100 until the snap finger inserts and locks into slot. The shape of shield 190 may be configured so that shield 190 is pinched onto first end 106 of sealing ring 100 during assembly of the seal system 400 and upon pressure from sputtering target 255 and isolation ring 210. In an exemplary embodiment, shield 190 may have an inner diameter of about 18.585"-18.645", when measured from a tip 190a of the shield 190. In an exemplary embodiment, shield 190 may have an inner diameter of about 19.095"-19.155", when measured from a base 190b of the shield 190.

Figure 3A:
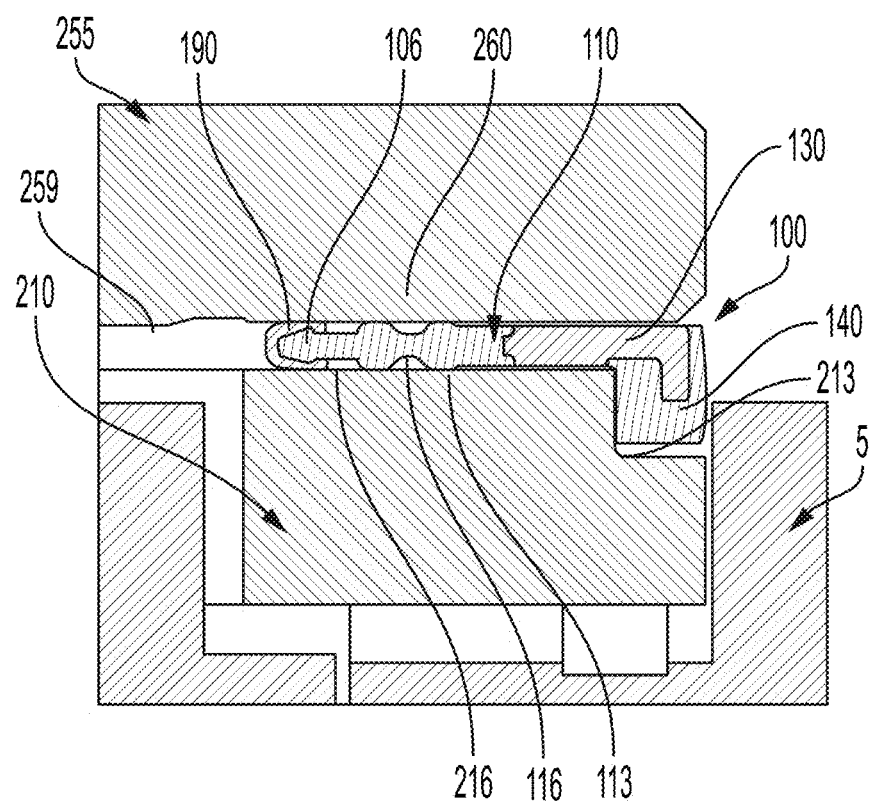
FIG. 3A shows an embodiment of a seal and seal system including an isolation ring and sputtering target assembled on a vacuum chamber in accordance with aspects disclosed herein.
Figure 3B:
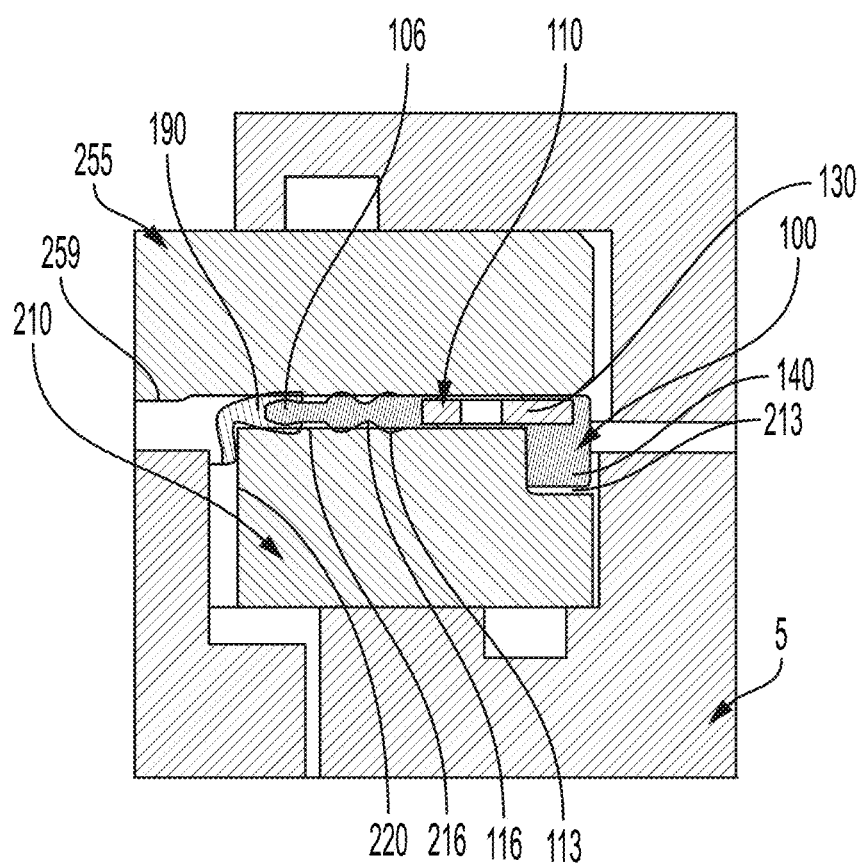
FIG. 3B shows an embodiment of a seal and seal system including an isolation ring and sputtering target assembled on a vacuum chamber in accordance with aspects disclosed herein.
Figure 4A:
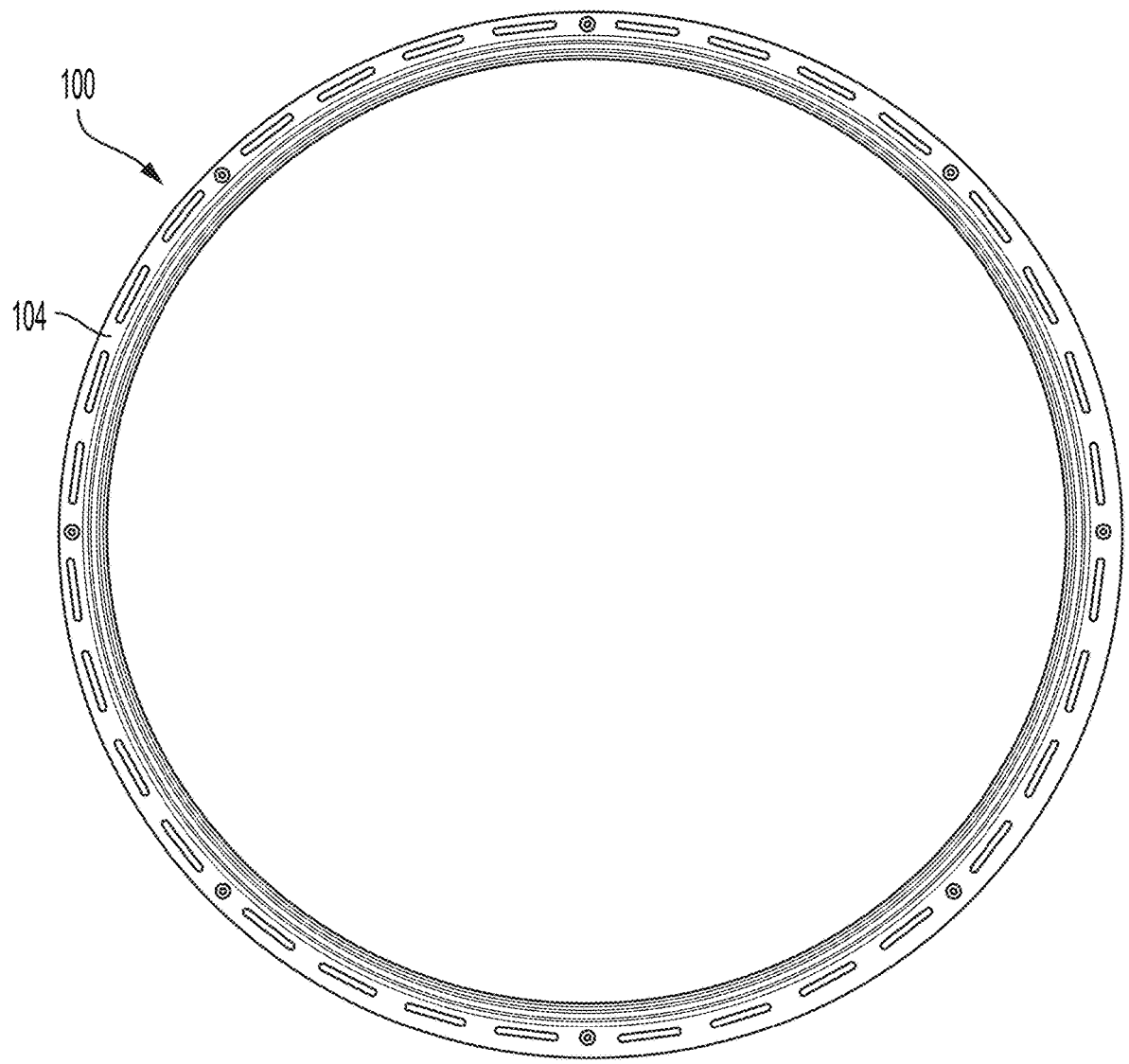
FIG. 4A shows a top view of an embodiment of a seal in accordance with aspects disclosed herein and FIG. 4B shows a bottom view of an embodiment of a seal in accordance with aspects disclosed herein.
Figure 4B:
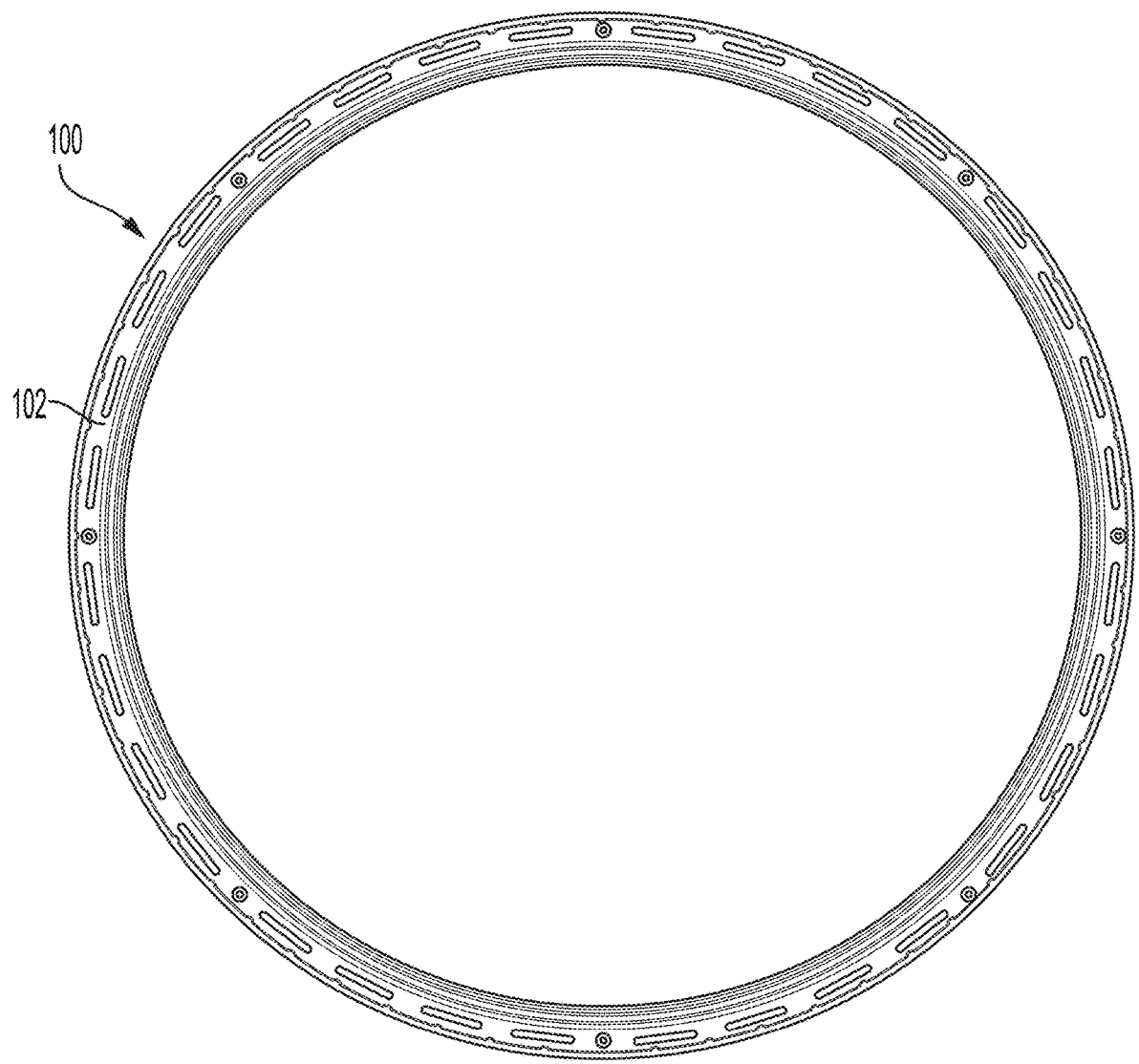
Figure 5A:
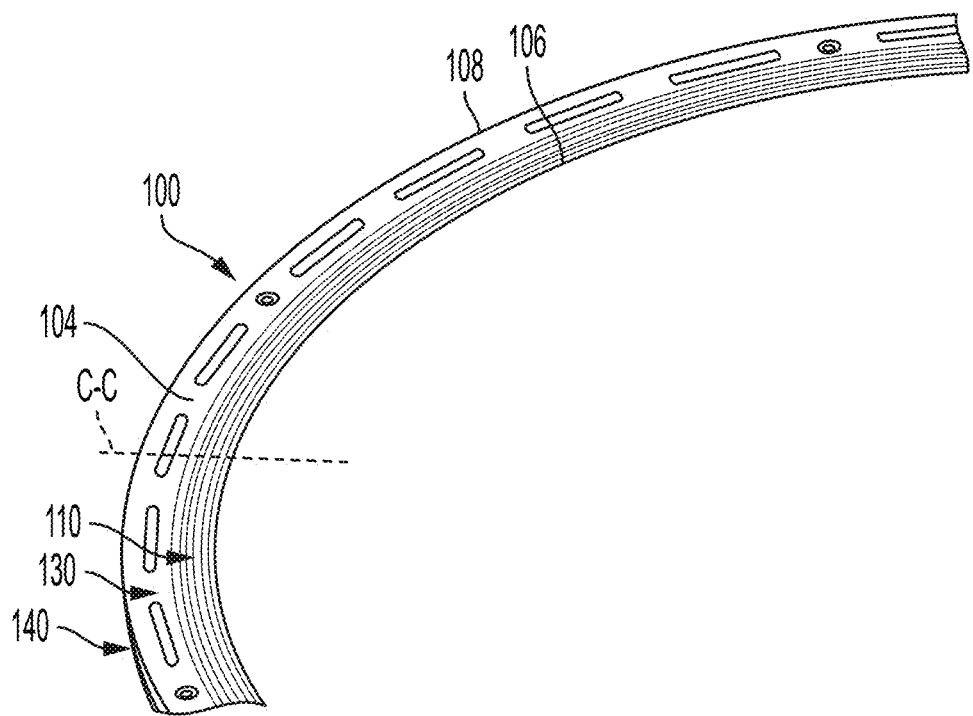
FIG. 5A shows an enlarged top view of an embodiment of a seal in accordance with aspects disclosed herein and FIG. 5B shows an enlarged bottom view of an embodiment of a seal in accordance with aspects disclosed herein.
Figure 5B:
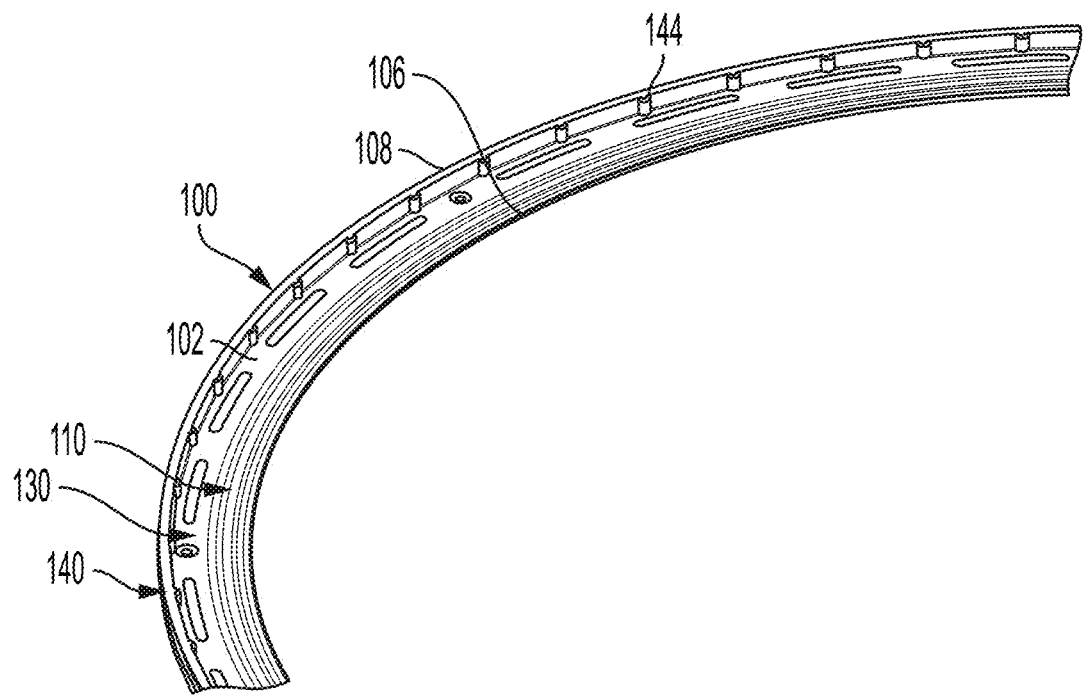
Figure 6A:
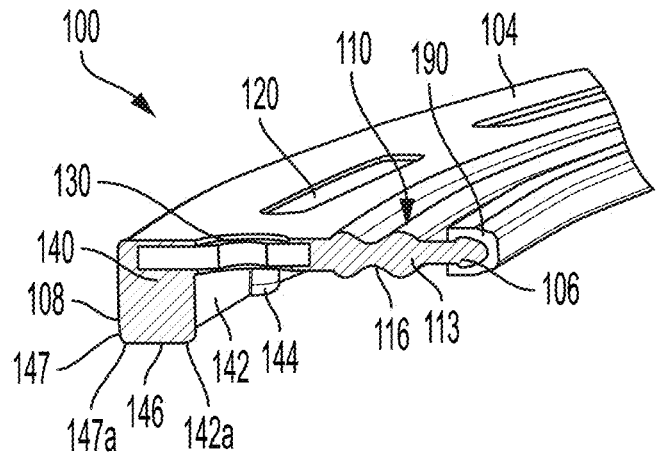
FIG. 6A shows a cross-sectional top view of an embodiment of a seal in accordance with aspects disclosed herein.
Figure 6B:
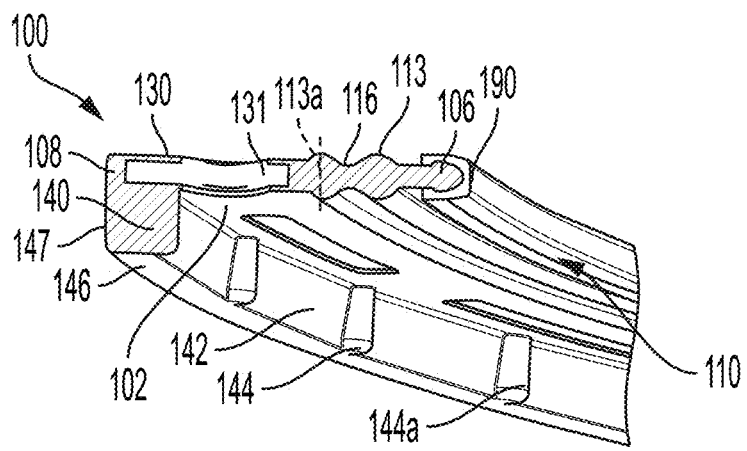
FIG. 6B shows a cross-sectional bottom view of an embodiment of a seal in accordance with aspects disclosed herein.
Figure 6C:
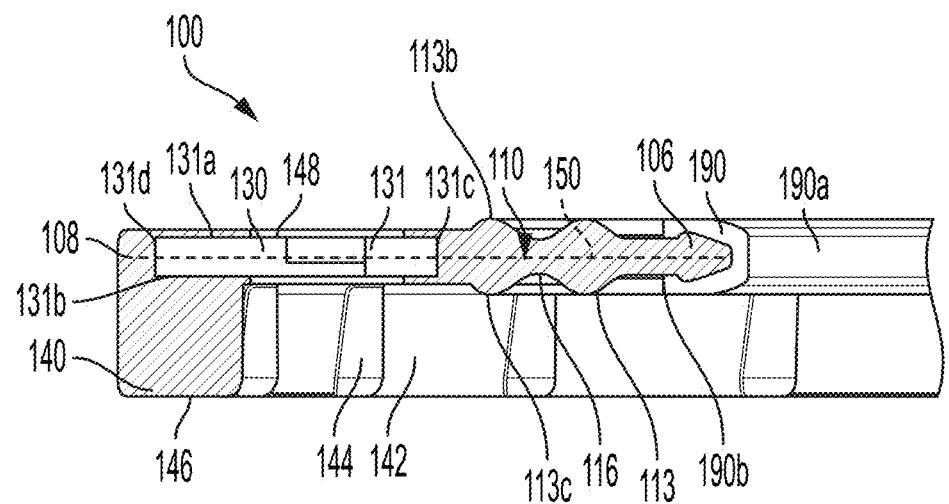
FIG. 6C shows a cross-sectional side view of an embodiment of a seal in accordance with aspects disclosed herein.

As shown in FIG. 3A, shield 190 may have a curved or rounded shape c-shape that has a relatively slim profile and that is sized and shaped to reflect the first end 106 of sealing ring 100. As shown in FIG. 3B, shield 190 may have an elongated tear-drop shape that extends into the interior of vacuum chamber 5 towards a center of the sealing ring 100. In an embodiment, elongated tear-drop shape of shield 190 may extend onto and over an interior edge of isolation ring 210. It is noted that other shapes, thicknesses, and sizes of shield 190 may also be incorporated. In an exemplary embodiment, shield 190 may have a width of 0.130" along the horizontal axis 150, when measured from tip 190a to base 190b. In another exemplary embodiment, shield 190 may have a height of about 0.114"-0.124" when measured in a vertical direction (parallel to vertical axis 113a) perpendicular to the horizontal axis 150.

Shield 190 may comprise any plasma suppression material or combination of materials as may be desired or suitable for a particular purpose or intended application. In an embodiment, shield 190 may comprise plasma inhibiting polytetrafluoroethylene (PTFE) material which is a synthetic fluoropolymer of tetrafluoroethylene. It is noted that any other materials that inhibit plasma and thermal damage may also be used. Materials may be selected based on their low coefficient of friction, in an example. Other materials may include, but are not limited to, polyimide, ceramics such as alumina and boron nitride, molybdenum disulfide, fluorinated ethylene propylene, and the like.

In an embodiment, shield 190 may be referred to as a plasma shield. In an embodiment, shield 190 may provide plasma arc suppression and protect the vacuum seal by inhibiting plasma arcing and thermal degradation of the vacuum seal material.

Therefore, the planar portion 148 of sealing ring 100 has a shield 190, compressible portion 110 and rigid portion 130, when traveling outward from the center of the sealing ring 100 along the horizontal axis 150.

Sealing ring 100 may further comprise a rim portion 140 situated on the first surface 102 and forming an "L" with the planar portion 148. The rim portion 140 has an inside wall 142 oriented toward the center of the sealing ring 100 perpendicular to the first surface 102, an outside wall 147 located on the exterior perimeter of sealing ring 100 perpendicular to the first surface, and a bottom wall 146 connecting a bottom 142a of inside wall 142 and a bottom 147a of outside wall 147. Inside wall 142 may be oriented toward the center of sealing ring 100. Bottom wall 146 may be oriented perpendicular to inside wall 142 and outside wall 147 to form a "U". The outside wall 147 and second end 108 may form a continuous surface linearly equidistant from first end 106 when measured along the horizontal axis 150 of planar portion 148. In an exemplary embodiment, rim portion 140 may be positioned adjacent rigid portion 130 of planar portion 148. In an exemplary embodiment, rim portion 140 may be positioned at the second end 108 of sealing ring 100. In an exemplary embodiment, rim portion 140 may extend perpendicular from rigid portion 130 and compressible portion 110 on the isolation ring facing first surface 102 of sealing ring 100. In an exemplary embodiment, sealing ring 100 may have an L-shape. Rim portion 140, rigid portion 130, and compressible portion 110 may be provided as a single, attached unit. Rim portion 140 may comprise the same material as the compressible portion 110. Rim portion 140 may comprise a similar material as the compressible portion 110. Rim portion 140 may be configured to selectively couple with a corresponding step-out portion 213 of isolation ring 210. Both inside wall 142 and bottom wall 146 (or inside wall 142, retention tabs 144, and/or bottom wall 146) may selectively engage with corresponding walls of the step-out portion 213 of isolation ring 210.

In an exemplary embodiment, the sealing ring 100 may have a thickness of about 0.270" when measured at the rim portion 140. Stated alternatively, in an exemplary embodiment, the distance between the bottom wall 146 and second side 104 of the sealing ring 100 may be about 0.270". Further, in another exemplary embodiment, the sealing ring 100 may have a thickness of about 0.085"-0.095" at the rigid portion 130. Stated alternatively, in an exemplary embodiment, the distance between the first side 102 and second side 104 of the sealing ring 100 at the rigid portion 130 may be about 0.085"-0.095". In further exemplary embodiments, the diameter of the second end 108 of the sealing ring 100 may be about 20.585"-20.645". In another exemplary embodiment, the diameter of the inside wall 142 of the sealing ring 100, at locations where a retention tab 144 is not present, may be about 20.325"-20.385".

Rim portion 140 may further include one or more (or a plurality of) retention tabs 144 positioned on and extending from inside wall 142 along the inner perimeter of the rim portion 140 toward the center of sealing ring 100. In an exemplary embodiment, the plurality of retention tabs 144 may be positioned equidistant along a circumference of inside wall 142. In an exemplary embodiment, the plurality of retention tabs 144 may be positioned at varying distances along the circumference of inside wall 142. In an exemplary embodiment, rim portion 140 may include 1, 2, 3, 4, 5, 6, 7, 8, 9, 10, 15, 20, 30, etc. retention tabs 144. Retention tabs 144 may be semi-circular in shape and extend from the bottom wall 146 (or bottom of inside wall 142*a*) to first side 102. Retention tabs 144 may have a chamfer near the bottom wall 146 (or bottom of inside wall 142*a*) to aid in placement of the sealing ring 100 onto the isolation ring 210. In an exemplary embodiment, an inner surface 144*a* of the retention tabs 144 may be about 10.10" from a center of the sealing ring 100. The inner surface 144*a* is the surface of tab 144 that is closest to the center of the sealing ring 100 while travelling along the horizontal axis 150.

In an exemplary embodiment, rim portion 140 may provide ease of alignment of sealing ring 100 onto isolation ring 210 during assembly of the seal system 400. In an exemplary embodiment, retention tabs 144 may provide self-centering of sealing ring 100 onto isolation ring 210. In an exemplary embodiment, retention tabs 144 may grip onto isolation ring 210 and may secure sealing ring 100 to isolation ring 210. In an exemplary embodiment, sealing ring 100 may be applied upside down, e.g., to an isolation ring 210 that is above sealing ring 100 and the retention tabs 144 may hold and secure sealing ring 100 to the upside down isolation ring 210 (e.g. retention tabs may hold and secure sealing ring 100 onto the isolation ring 210, when isolation ring 210 and sealing ring 100 are inverted such that isolation ring 210 is oriented above sealing ring 100 and sealing ring 100 is being pulled away from isolation ring 210 by gravity).

Figure 7:
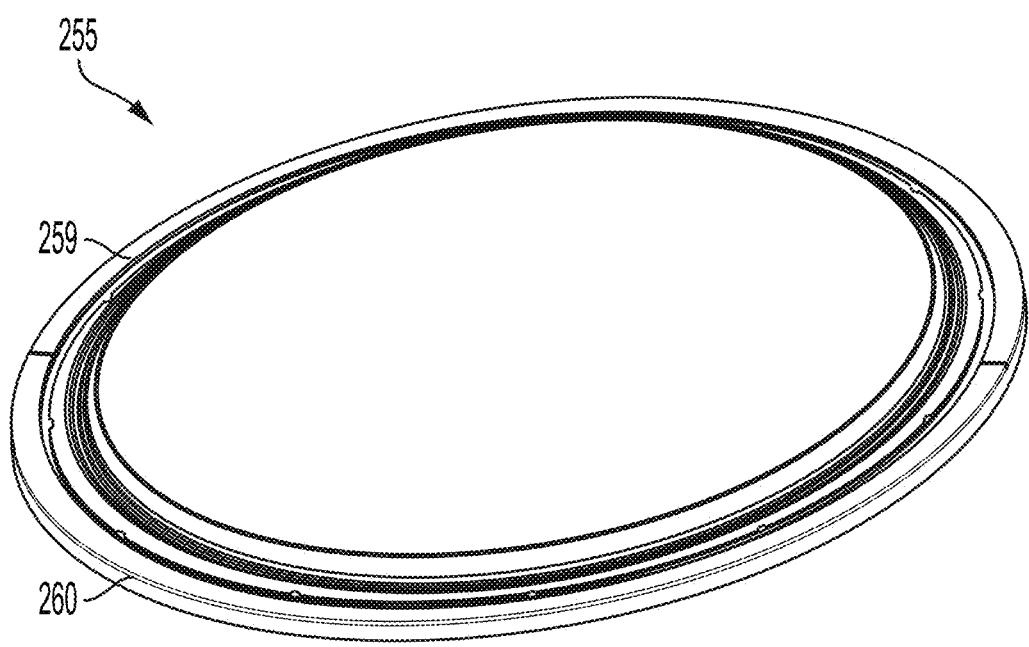
FIG. 7 shows a perspective view of an embodiment of a sputtering target in accordance with aspects disclosed herein.

Turning to FIG. 7, shown is sputtering target 255 comprising seal mating surface 259. As described, seal mating surface 259 may be a generally continuous and/or smooth flange surface, i.e., a surface devoid of any grooves, vent slots, scallops, and other shapes or features having similar function see also FIGS. 3A-B. In an exemplary embodiment, the flange (seal mating surface 259) of the backing plate 260 of sputtering target 255 is featureless. In an embodiment, sputtering target 255 eliminates the conventional O-ring seal, groove, vent slots, scallops, and other shapes or features having similar function shown in FIGS. 1A-F which may be susceptible to the failures shown in FIGS. 2A-F, including arcing events, oxidation, nodule formation, degradation, abrasion, redeposition, and particle generation often occur near or adjacent the O-ring seal, vent slots, and/or scallops. In an exemplary embodiment, sputtering target 255 also eliminates the radial single point fulcrum in conventional sputtering target vacuum chamber assemblies that can contribute to the mechanical movement of components during dynamic sputter cycling of the sputtering target 255.

Seal mating surface 259 of sputtering target 255 (e.g the flange of the backing plate 260 of the sputtering target 255 of non-monolithic target or peripheral flange of monolithic sputtering target 255) may be configured to selectively interface with sealing ring 100. Seal mating surface 259 of sputtering target 255 may be configured to selectively interface with second side 104 of sealing ring 100, including compressible portion 110, rigid portion 130 (encapsulated by a compressible material), and shield 190. Sputtering target 255 may provides a vacuum seal with sealing ring 100.

Sputtering target 255 may comprise any material or combination of materials as may be desired or suitable for a particular purpose or intended application. In an embodiment, sputtering target 255 may comprise copper, titanium, gold, and the like. It is noted that any other metals, alloys, oxides, and nitrides thereof materials may also be used. Materials may be selected based on their sputtering capabilities, in an example. Other materials may include, but are not limited to, aluminum, tungsten, nickel, silicon, germanium, and the like.

Figure 8A:
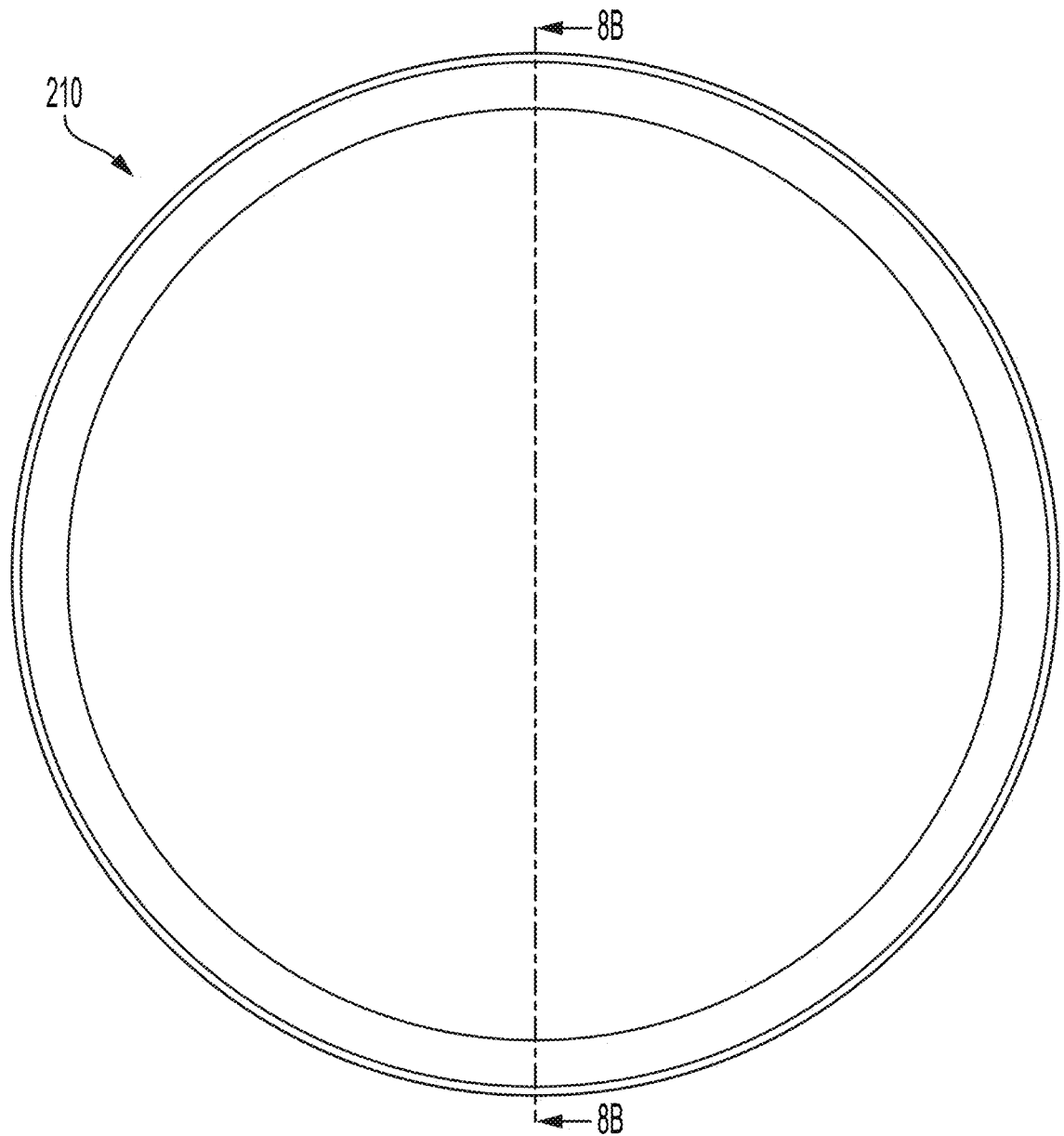
FIG. 8A shows a top view of an embodiment of an isolation ring in accordance with aspects disclosed herein.
Figure 8B:
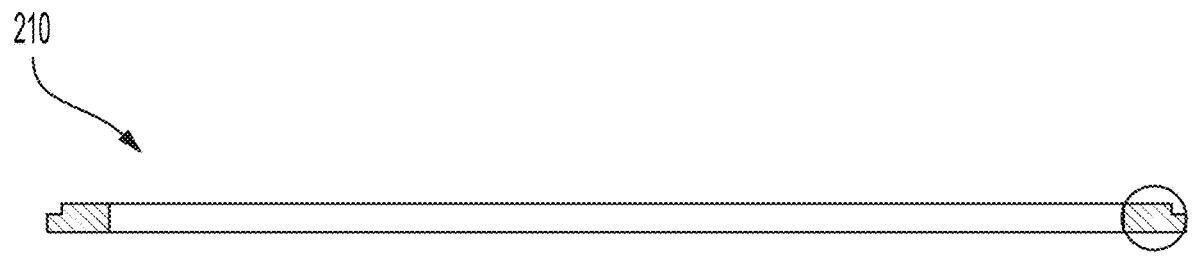
FIG. 8B shows a cross-sectional side view of an embodiment of an isolation ring in accordance with aspects disclosed herein.
Figure 8C:
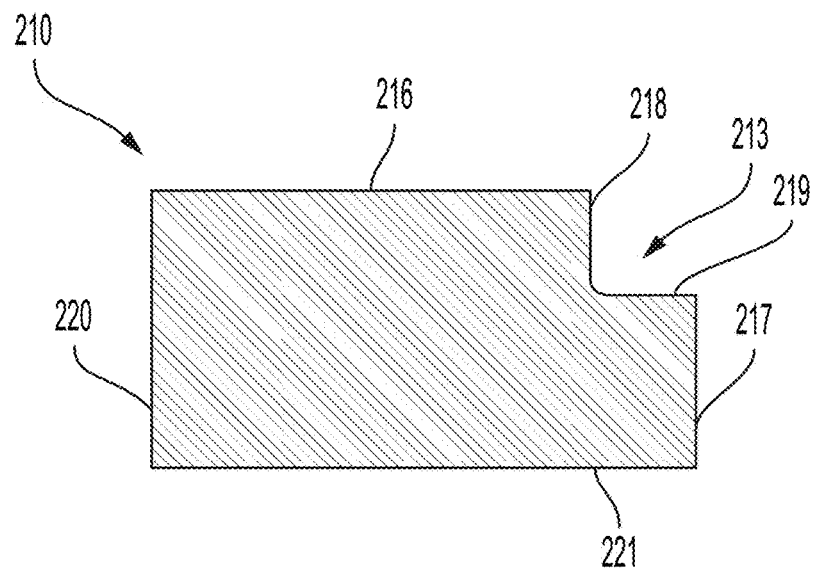
FIG. 8C shows an enlarged cross-sectional side view of an embodiment of an isolation ring in accordance with aspects disclosed herein.

Turning to FIGS. 8A-C, shown is isolation ring 210 comprising seal mating surface 216 and rim mating step out 213. As described, seal mating surface 216 (top surface) may be a generally continuous and/or smooth surface and rim mating step out 213 may provide a step out 213 on an outer circumference of the isolation ring 210. Rim mating step out 213 may be configured to selectively engage both inside wall 142 and bottom wall 146 of the rim portion 140 (or inside wall 142 and retention tabs 144). Rim mating step out 213 may generally have a cut out of approximately 90 degrees. In an exemplary embodiment, step out 213 may be formed by cutting vertically and horizontally into the top of the outer diameter of the isolation ring 210. Stated alternatively, in an exemplary embodiment, step out 213 may be formed in the mating surface 216 and outer surface 217 of the isolation ring 210, thereby creating a vertical face 218 and horizontal face 219 of the step out 213. In an exemplary embodiment, once the step out 213 is formed in the isolation ring, the vertical face 218 may be offset by about 0.200" from the outer surface 217 and the horizontal face 219 may be offset by about 0.200" from the mating surface 216. In an exemplary embodiment, the inner diameter of the isolation ring 210 may be about 18.505", when measured at the inner surface 220 of the isolation ring 210. In a further exemplary embodiment, the outer diameter of the isolation ring 210 may be about 20.625", when measured at the outer surface 217 of the isolation ring 210. In an additional exemplary embodiment, the diameter of the isolation ring 210 may be about 20.225", when measured at the vertical face 218 of the step out 213 of the isolation ring 210. In a further exemplary embodiment, the thickness of the isolation ring 210 may be about 0.538", when measured from mating surface 216 to a bottom surface 221 of isolation ring 210. In an additional exemplary embodiment, the thickness of the isolation ring 210 may be about 0.338", when measured from horizontal face 219 to a bottom surface 221 of the isolation ring 210. In another exemplary embodiment, the width of the isolation ring 210 may be about 1.06", when measured from the outer surface 217 to inner surface 220. The outer surface 217 is located opposite of the inner surface 220.

Seal mating surface 216 of isolation ring 210 may be configured to selectively couple with sealing ring 100. Seal mating surface 216 of isolation ring 210 may be configured to selectively couple with first side 102 of sealing ring 100, including compressible portion 110, rigid portion 130 (encapsulated by a compressible material), shield 190, and rim portion 140. Isolation ring 210 may provide a vacuum seal with sealing ring 100. Together the sealing ring 100, sputtering target 255, and isolation ring 210 may also provide an increased sealing surface or interface and a buffer between sputtering target 255 and isolation ring 210.

Isolation ring 210 may comprise any material or combination of materials as may be desired or suitable for a particular purpose or intended application. In an embodiment, isolation ring 210 may comprise a highly polished ceramic dielectric material. It is noted that any other materials that can electrically isolate the sputtering target 255 from the vacuum chamber 5 may also be used. Materials may be selected based on their electrical insulation, in an example. Other materials may include, but are not limited to, glass, plastics and polymers such as polyethylene (PE), polypropylene (PP), polycarbonate (PC), polyimide (PI), and polytetrafluoroethylene (PTFE), mica, epoxy resin, polyethylene terephthalate (PET), and the like.

FIGS. 13A-B and 14A-D show end of life sputtering targets 255 using sealing ring 100 and sealing system 400. The resulting sputtering target 255 shows no indication of arcing, particles, or flange abrasion. Additionally, sidewall oxide formation is consistently controlled.

Figure 15A:
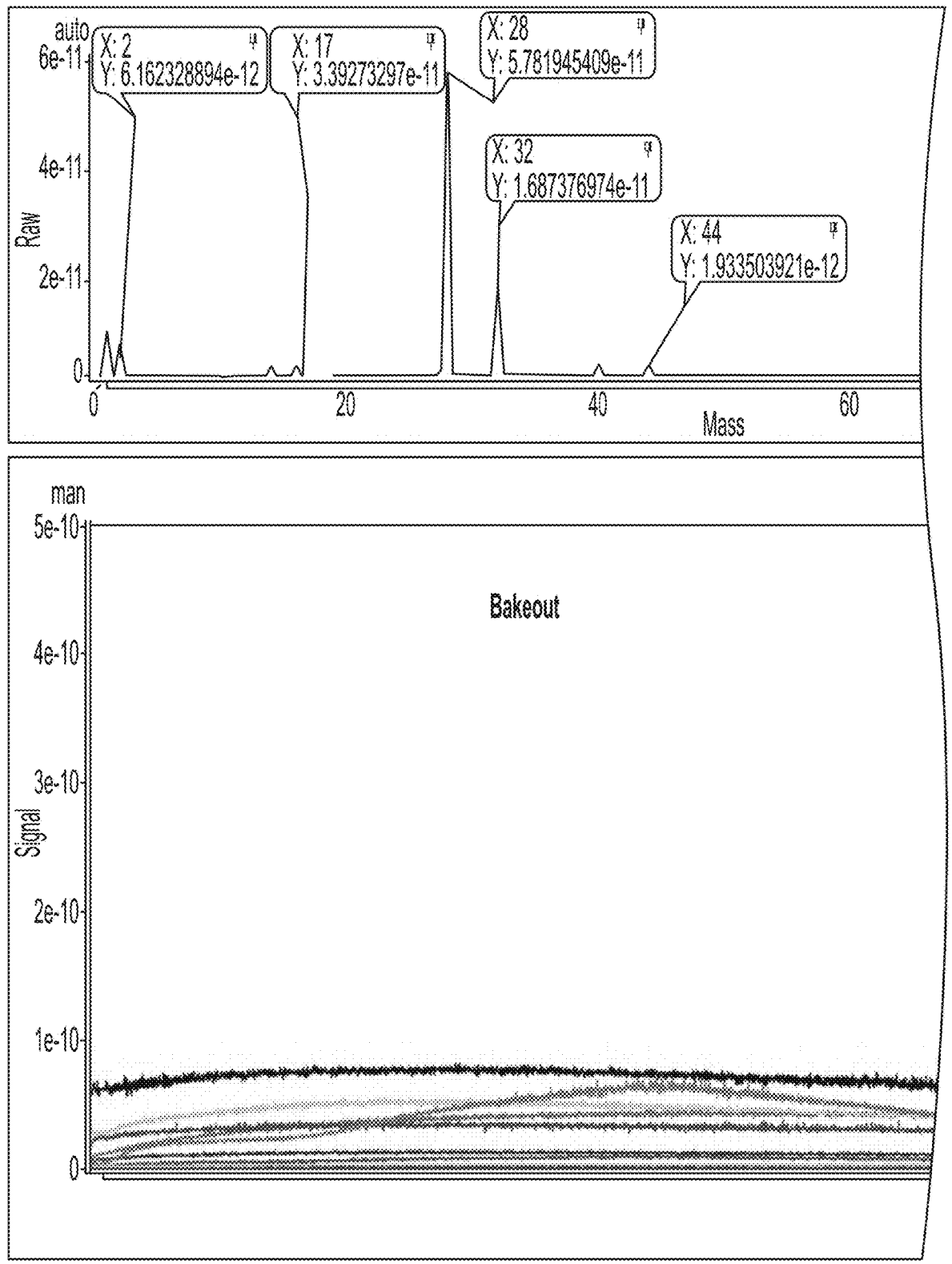
FIGS. 15A-E show experimental data using the described seal and sealing systems in accordance with aspects disclosed herein.
Figure 15A:
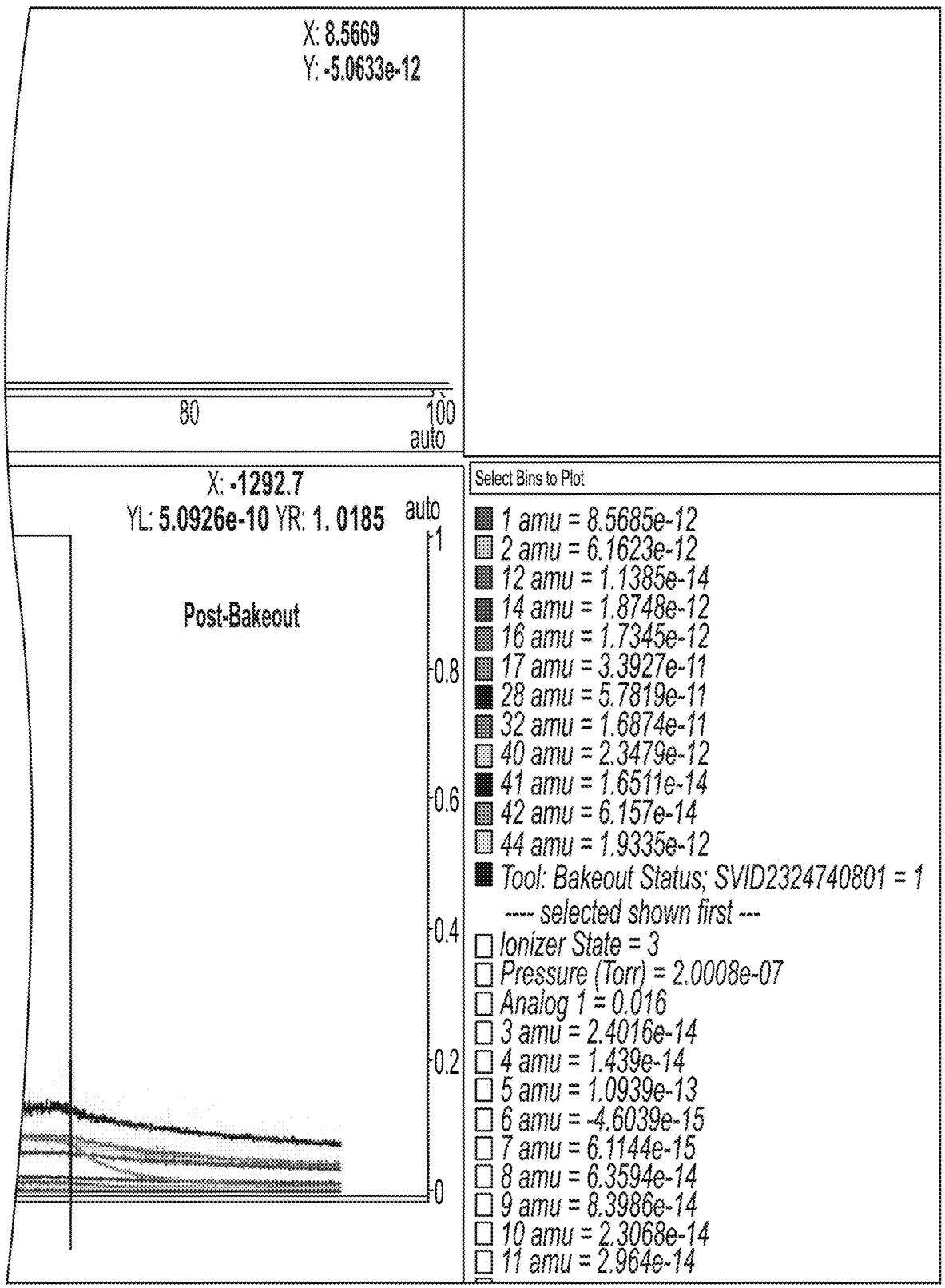
Figure 15B:
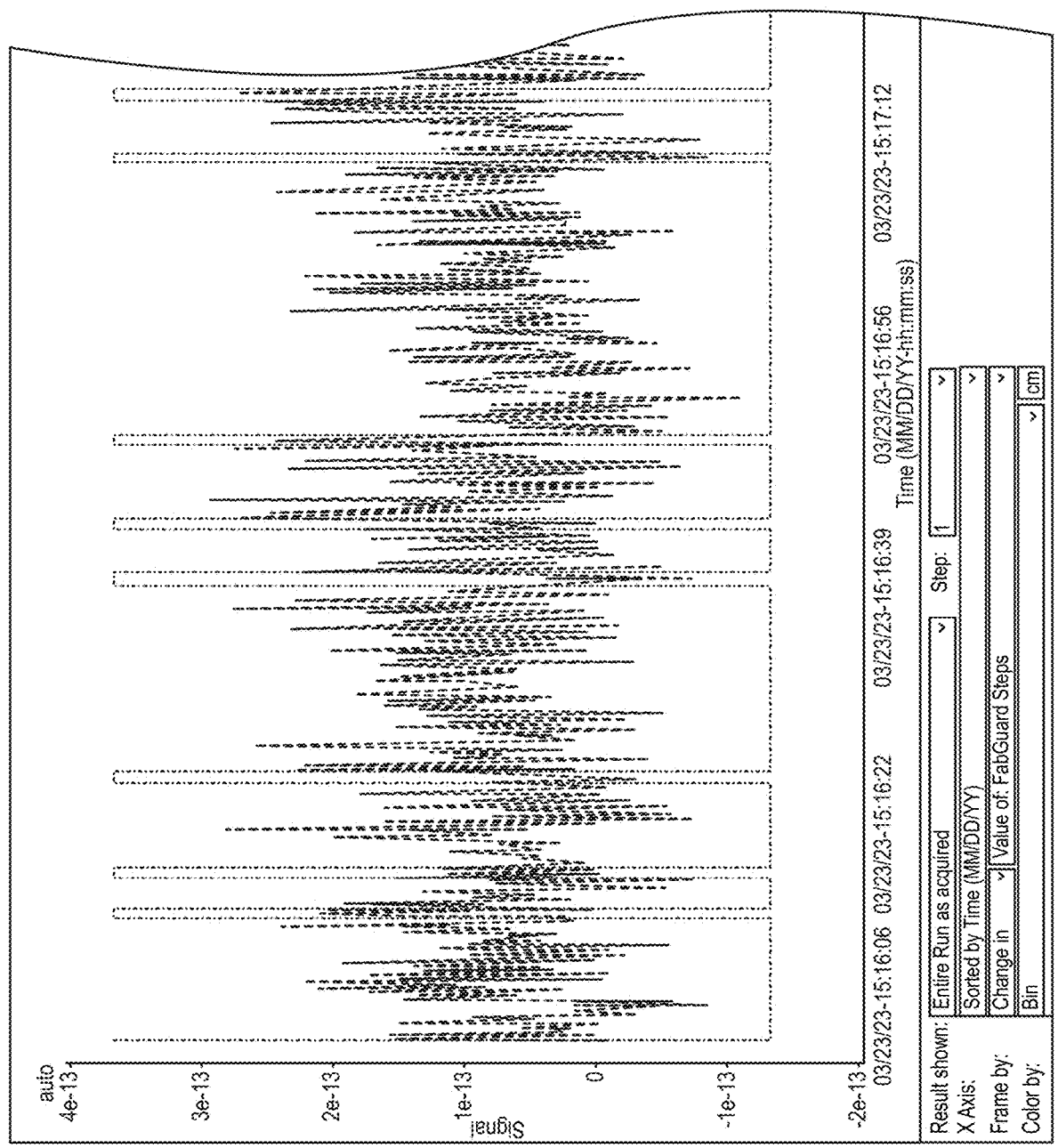
Figure 15B:
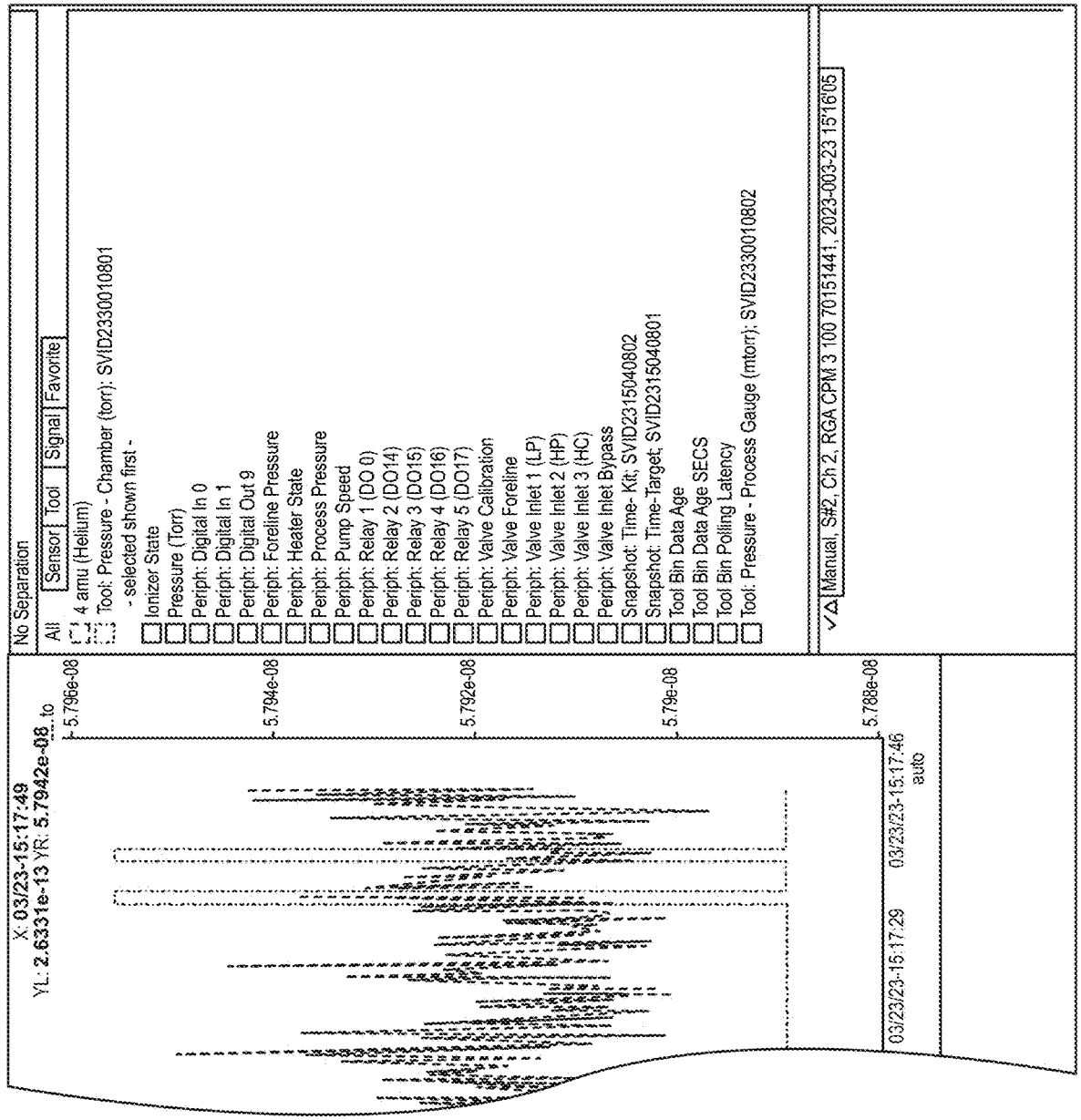
Figure 15C:
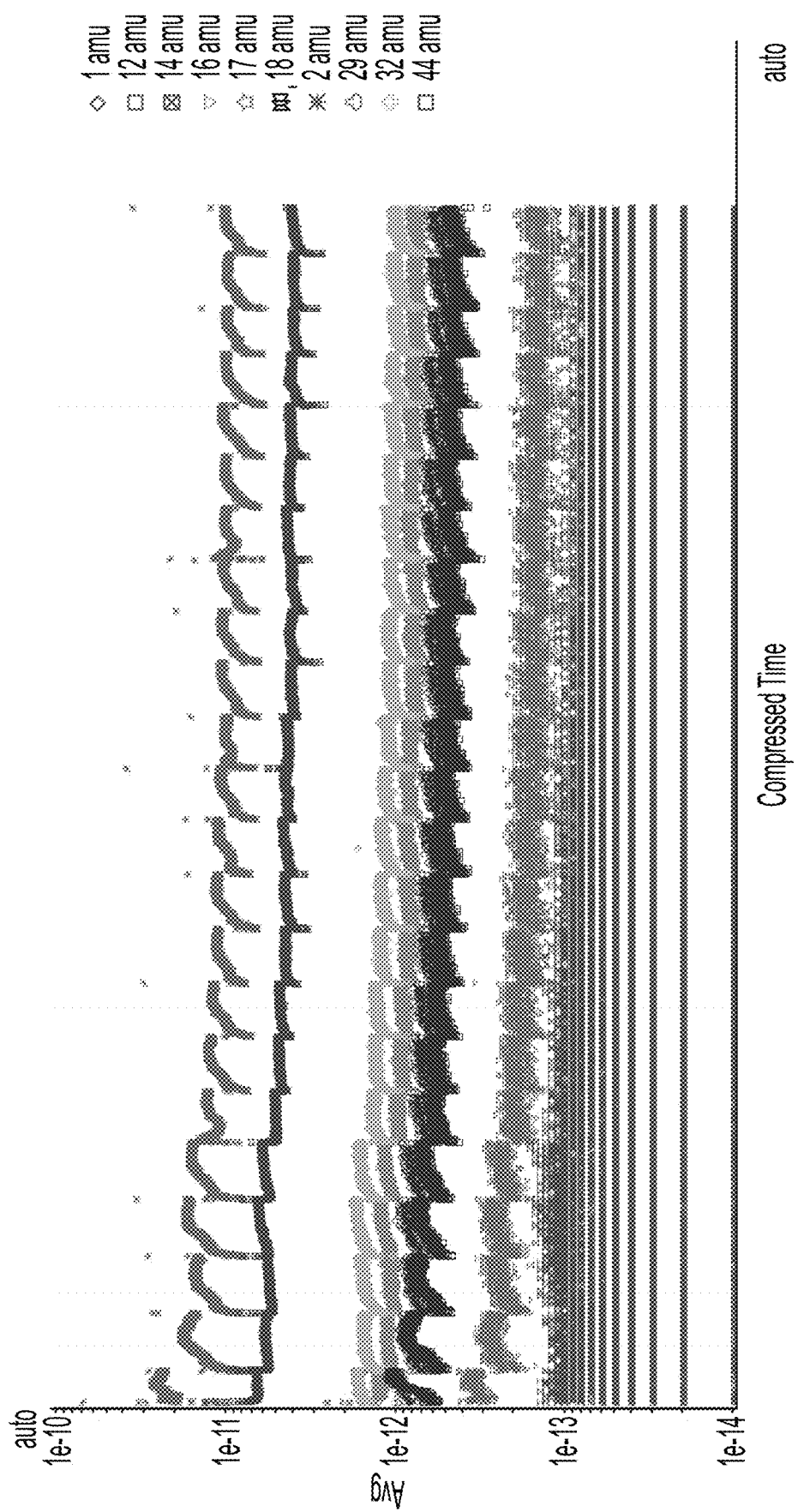
Figure 15D:
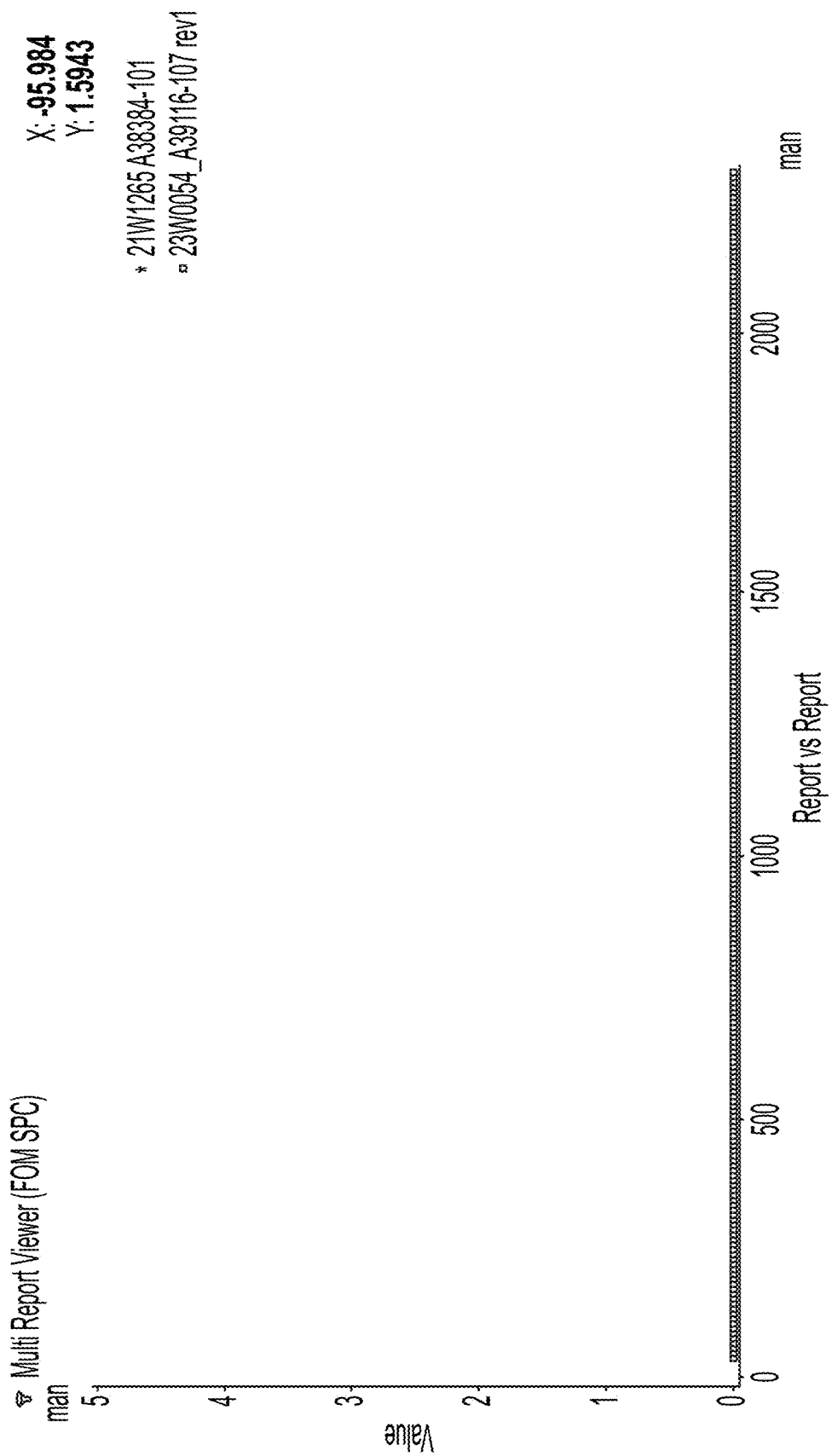
Figure 15E:
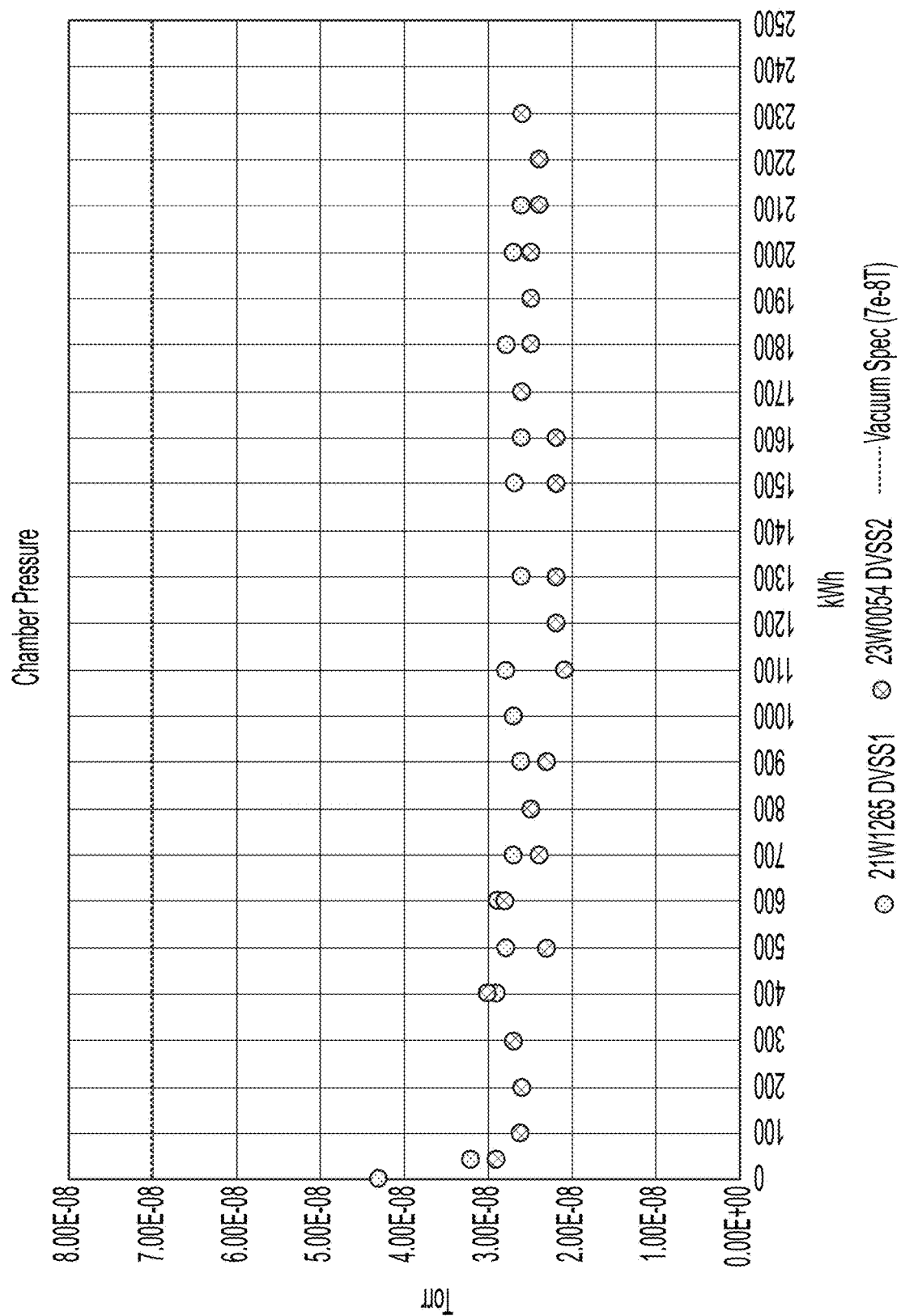

FIGS. 15A-E show various experiential data taken during the life of sputtering target 255 using sealing ring 100 and sealing system 400. For example, FIG. 15A indicates the observed bake-out. FIG. 15B indicates that no helium leakage was observed at the seal. FIG. 15C indicates that the gas load was stable during processing of the sputtering target 255. FIG. 15D indicates that no arc discharge events were captured during the sputtering target 255 life. FIG. 15E indicates the idle mode chamber pressure was stable throughout the sputtering target 255 life.

Although the embodiments of the present teachings have been illustrated in the accompanying drawings and described in the foregoing detailed description, it is to be understood that the present teachings are not to be limited to just the embodiments disclosed, but that the present teachings described herein are capable of numerous rearrangements, modifications and substitutions without departing from the scope of the claims hereafter. The claims as follows are intended to include all modifications and alterations insofar as they come within the scope of the claims or the equivalent thereof.

What is claimed is:

1. A sealing kit for a physical vapor deposition (PVD) vacuum chamber, comprising:
   a sealing ring for the PVD vacuum chamber comprising:
      a compressible portion, wherein the compressible portion comprises at least one protrusion and at least one recess;
      a rigid portion adjacent the compressible portion, wherein the rigid portion has a rib that is substantially encapsulated by a secondary material;
      a rim that extends from a first surface of the sealing ring and is configured to selectively couple to an isolation ring;
      a removable shield that is configured to selectively couple to a first end of the compressible portion and that is configured to isolate the compressible portion from an interior of the vacuum chamber;
   the isolation ring, comprising:
      a first surface configured to selectively interface with the compressible portion and the rigid portion of the sealing ring when installed in the PVD vacuum chamber, wherein the first surface is generally flat;
      a step-out portion configured to selectively interface with the rim of the sealing ring when installed in the PVD vacuum chamber; and
   a sputtering target, comprising:
      a peripheral flange surface of a first surface configured to interface with the sealing ring, when installed in the PVD vacuum chamber, wherein the peripheral flange surface is devoid of any O-ring grooves, vent slots, and scallops and is configured to contact the sealing ring with a flat surface.

2. A sealing ring for a physical vapor deposition (PVD) vacuum chamber comprising:
   a compressible portion, wherein the compressible portion comprises at least one protrusion and at least one recess;
   a rigid portion adjacent the compressible portion, wherein the rigid portion has a rib that is substantially encapsulated by a secondary material;
   a rim that extends from a first surface of the sealing ring and is configured to selectively couple to an isolation ring;
   a removable shield that is configured to selectively couple to a first end of the compressible portion and that is configured to isolate the compressible portion from an interior of a vacuum chamber.

3. The sealing ring of claim 2, wherein the compressible portion comprises a fluorocarbon, fluoroelastomer, and/or fluorine kautschuk material.

4. The sealing ring of claim 2, wherein the secondary material is a same material as the compressible portion and the rim.

5. The sealing ring of claim 2, wherein the at least one protrusion extends past the first surface and a second, opposite surface of the sealing ring.

6. The sealing ring of claim 2, wherein the at least one recess terminates prior to the first surface and a second, opposite surface of the sealing ring.

7. The sealing ring of claim 2, wherein each of the at least one protrusion and each of the at least one recess alternate.

8. The sealing ring of claim 2, wherein the compressible material and at least one recess are configured to entrap particulates.

9. The sealing ring of claim 2, wherein the rib of the rigid portion is comprised of aluminum.

10. The sealing ring of claim 2, wherein the compressible portion and the rigid portion are approximately the same length.

11. The sealing ring of claim 2, wherein the shield is configured to snap fit with the first end of the compressible portion.

12. The sealing ring of claim 2, wherein the shield is configured to inhibit plasma arcing and thermal degradation of the compressible portion.

13. The sealing ring of claim 2, wherein the shield comprises polytetrafluoroethylene.

14. The sealing ring of claim 2, wherein the rim further includes a plurality of retention tabs.

15. The sealing ring of claim 2, wherein the sealing ring is configured to selectively interface with the isolation ring by an interference fit, thereby forming a seal between the sealing ring and isolation ring when installed in the PVD vacuum chamber.

16. The sealing ring of claim 2, wherein the sealing ring is configured to self-center with the isolation ring using the plurality of retention tabs on the rim and a step-out portion of the isolation ring cut out of approximately 90 degrees.

17. The sealing ring of claim 2, wherein a second surface of the sealing ring is configured to selectively interface with a sputtering target, thereby forming a seal between the sealing ring and sputtering target when installed in the PVD vacuum chamber.

18. The sealing ring of claim 17, wherein the sputtering target is devoid of any grooves, vent slots, and scallops and is configured to contact the sealing ring with a flat surface.

19. The sealing ring of claim 17, wherein the sealing ring is configured to provide a buffer between the sputtering target and the isolation ring.

20. A sealing kit for a vacuum chamber, comprising:
   a sealing ring, wherein the sealing ring includes a compressible portion, a rigid portion adjacent the compressible portion, and a rim extending perpendicularly from the rigid portion, an isolation ring configured to selectively interface with a first mating surface of the isolation ring including the rim, wherein the isolation ring includes a cut out configured to selectively accommodate and contact the rim of the sealing ring, thereby forming a seal between the isolation ring and the sealing ring when installed in a PVD vacuum chamber;

a sputtering target comprising a substantially planar first mating surface configured to selectively interface to a second mating surface of the sealing ring, thereby forming a seal between the sputtering target and the sealing ring when installed in a PVD vacuum chamber.

21. The sealing kit of claim 20, wherein the first mating surface of the sputtering target is devoid of any grooves, vent slots, and scallops.

22. The sealing kit of claim 20, wherein the compressible portion comprises at least one protrusion and at least one recess, wherein each of the at least one protrusion and each of the at least one recess alternate.

23. The sealing kit of claim 20, wherein a rib of the rigid portion is suspended in a same material that comprises the compressible material and the rim.

24. The sealing kit of claim 20, wherein the sealing ring further includes a plasma shield configured to attach to an inner perimeter side of the compressible portion.

25. The sealing kit of claim 20, wherein the sputtering target and the isolation ring each form a seal with the sealing ring.

26. The sealing kit of claim 20, wherein the sputtering target and the isolation ring are isolated from each other by the sealing ring.

27. A method for assembling the sealing kit of claim 20, comprising:
placing an isolation ring on a PVD vacuum chamber, wherein the isolation ring includes a step out on a mating surface;
placing a sealing ring on the mating surface of the isolation ring, the sealing ring having a first mating surface and a second mating surface on an opposite side of the first mating surface, wherein the first mating surface of the sealing ring includes a rim configured to selectively couple to the step out of the isolation ring and wherein the first mating surface of the sealing ring contacts the mating surface of the isolation ring;
placing a sputtering target on the second mating surface of the sealing ring, wherein the sealing ring includes a compressible portion and a shield, and wherein the sputtering target is configured to compress the compressible portion and the shield of the sealing ring;
wherein the isolation ring and the sealing ring form a seal when installed in the PVD vacuum chamber, and the sealing ring and the sputtering target form a seal when installed in the PVD vacuum chamber.

28. The method of claim 27, wherein the sputtering target and the isolation ring are isolated from each other by the sealing ring.

* * * * *